(12) United States Patent
Kim

(10) Patent No.: US 10,436,836 B2
(45) Date of Patent: Oct. 8, 2019

(54) UNBALANCED MULTIPLEXER AND SCAN FLIP-FLOPS APPLYING THE SAME

(71) Applicant: SAMSUNG ELECTRONICS CO., LTD., Suwon-si, Gyeonggi-do (KR)

(72) Inventor: Min-Su Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 303 days.

(21) Appl. No.: 15/332,305

(22) Filed: Oct. 24, 2016

(65) Prior Publication Data

US 2017/0276729 A1 Sep. 28, 2017

(30) Foreign Application Priority Data

Mar. 28, 2016 (KR) .................. 10-2016-0036955

(51) Int. Cl.
| | |
|---|---|
| *G01R 31/317* | (2006.01) |
| *G01R 31/3177* | (2006.01) |
| *G01R 31/00* | (2006.01) |
| *G01R 31/3185* | (2006.01) |

(52) U.S. Cl.
CPC ... *G01R 31/31725* (2013.01); *G01R 31/3177* (2013.01); *G01R 31/31723* (2013.01); *G01R 31/318541* (2013.01); *G01R 31/31858* (2013.01)

(58) Field of Classification Search
None
See application file for complete search history.

(56) References Cited

U.S. PATENT DOCUMENTS

| | | | | |
|---|---|---|---|---|
| 5,815,023 | A | * | 9/1998 | Webber ................. G06F 13/364 327/407 |
| 5,938,782 | A | * | 8/1999 | Kay ............... G01R 31/318541 365/201 |
| 6,678,846 | B1 | | 1/2004 | Maeno |
| 6,822,976 | B1 | * | 11/2004 | Riesenman ......... G06F 13/4027 326/38 |
| 6,850,103 | B2 | | 2/2005 | Ikeno et al. |
| 7,157,930 | B2 | | 1/2007 | Hirata |
| 7,162,673 | B2 | | 1/2007 | Wong |
| 7,345,519 | B2 | | 3/2008 | Hirata |

(Continued)

FOREIGN PATENT DOCUMENTS

| | | |
|---|---|---|
| JP | 2003168960 A | 6/2003 |
| JP | 2008070375 A | 3/2008 |

*Primary Examiner* — Justin R Knapp
(74) *Attorney, Agent, or Firm* — Volentine, Whitt & Francos, PLLC

(57) ABSTRACT

An unbalanced multiplexer and a scan flip-flop including the unbalanced multiplexer, wherein the unbalanced multiplexer includes a first transmission circuit transmitting a first input signal to an output terminal according to a logic state of a selection signal; and a second transmission circuit transmitting a second input signal to the output terminal according to the logic state of the selection signal. A delay characteristic of a first transmission path from a first input terminal to the output terminal along which the first input signal of the first transmission circuit is transmitted, and a delay characteristic of a second transmission path from a second input terminal to the output terminal along which the second input signal of the second transmission circuit is transmitted, are set differently.

11 Claims, 16 Drawing Sheets

(56) References Cited

U.S. PATENT DOCUMENTS

| | | | |
|---|---|---|---|
| 7,525,341 B1 * | 4/2009 | Rosen | H03K 19/00323 |
| | | | 326/38 |
| 7,737,721 B2 | 6/2010 | Fukuoka | |
| 7,956,661 B2 | 6/2011 | Machida | |
| 7,994,823 B2 | 8/2011 | Lee et al. | |
| 8,493,119 B2 | 7/2013 | Leach et al. | |
| 8,667,349 B2 | 3/2014 | Hsieh et al. | |
| 8,866,528 B2 | 10/2014 | Lin et al. | |
| 8,880,965 B2 | 11/2014 | Zhang et al. | |
| 9,081,058 B2 | 7/2015 | Yonetoku et al. | |
| 9,081,061 B1 | 7/2015 | Agarwal et al. | |
| 9,110,141 B2 | 8/2015 | Lin et al. | |
| 9,122,823 B2 | 9/2015 | Agarwal et al. | |
| 10,069,508 B1 * | 9/2018 | Zhang | H03M 1/662 |
| 2006/0282727 A1 | 12/2006 | Hoshaku | |
| 2007/0236263 A1 * | 10/2007 | Ramaraju | H03K 3/012 |
| | | | 327/112 |
| 2008/0231336 A1 | 9/2008 | Wu et al. | |
| 2014/0210526 A1 * | 7/2014 | Masleid | H04L 7/005 |
| | | | 327/152 |
| 2015/0113345 A1 | 4/2015 | Chen et al. | |

\* cited by examiner

UNBALANCED MULTIPLEXER AND SCAN FLIP-FLOPS APPLYING THE SAME

CROSS-REFERENCE TO RELATED APPLICATION

A claim of priority under 35 U.S.C. § 119 is made to Korean Patent Application No. 10-2016-0036955, filed on Mar. 28, 2016, in the Korean Intellectual Property Office, the disclosure of which is incorporated herein in its entirety by reference.

BACKGROUND

The inventive concepts described herein relate to a device and a method of testing a digital logic circuit, and more particularly to an unbalanced multiplexer usable for a scan test and a scan flip-flop applying the unbalanced multiplexer.

Design for testability (DFT) technology for testing a semiconductor chip may be widely used to maintain quality of the semiconductor chip. Scan test technology using a flip-flop may typically be used to enable low cost testing. Research has recently focused on reducing power consumption of semiconductor chips. Accordingly, scan test technology capable of stably testing semiconductor chips at a low voltage is needed.

SUMMARY

Embodiments of the inventive concept provide an unbalanced multiplexer for stably testing a semiconductor chip at a low voltage.

Embodiments of the inventive concept also provide a scan flip-flop for stably testing a semiconductor chip at a low voltage.

Embodiments of the inventive concept provide an unbalanced multiplexer including a first transmission circuit including a first pull-up circuit connected between a source voltage terminal and an output terminal, and a first pull-down circuit connected between the output terminal and a ground voltage terminal, the first transmission circuit configured to apply a selection signal and a first input signal to the first pull-up circuit and the first pull-down circuit, and to transmit the first input signal to the output terminal according to a logic state of the selection signal; and a second transmission circuit including a second pull-up circuit connected between the source voltage terminal and the output terminal, and a second pull-down circuit connected between the output terminal and the ground voltage terminal, the second transmission circuit configured to apply the selection signal and a second input signal to the second pull-up circuit and the second pull-down circuit, and to transmit the second input signal to the output terminal according to the logic state of the selection signal. A delay characteristic of a first transmission path from a first input terminal to the output terminal along which the first input signal of the first transmission circuit is transmitted, and a delay characteristic of a second transmission path from a second input terminal to the output terminal along which the second input signal of the second transmission circuit is transmitted, are set to be different.

Embodiments of the inventive concept provide a scan flip-flop including a multiplexer including a first input terminal, a second input terminal, and a selection terminal, and configured to transmit a signal input to one of the first input terminal and the second input terminal to a first node according to a logic state of a selection signal applied to the selection terminal; and a latch circuit configured to latch the signal transmitted to the first node in response to a clock signal and to output the latched signal to an output terminal. A delay characteristic of a first transmission path from the first input terminal to the first node and a delay characteristic of a second transmission path from the second input terminal to the first node are set to be different.

Embodiments of the inventive concept also provide an unbalanced multiplexer including a first transmission circuit configured to transmit a first signal along a first transmission path from a first input terminal to an output terminal according to a logic state of a selection signal; and a second transmission circuit configured to transmit a second signal along a second transmission path from a second input terminal to the output terminal according to the logic state of the selection signal. The first transmission path is configured to have a delay characteristic that is set to be different than a delay characteristic of the second transmission path.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1:
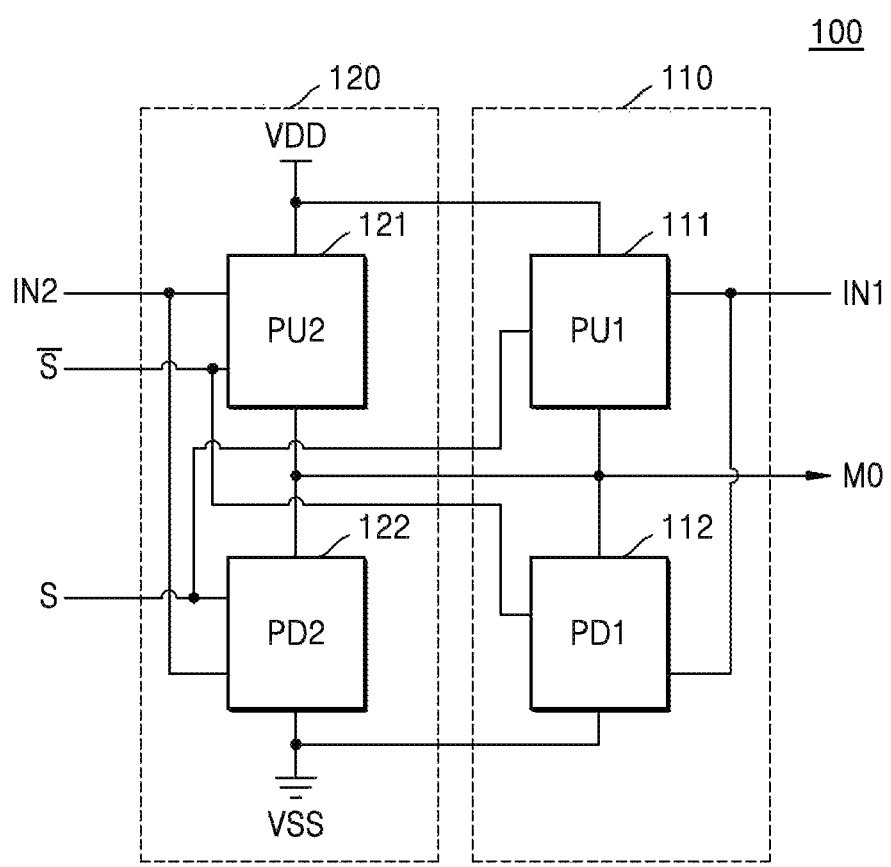
FIG. 1 illustrates a schematic block diagram of an unbalanced multiplexer according to an embodiment of the inventive concept.

Embodiments of the inventive concept will be more clearly understood in view of the following description taken in conjunction with the accompanying figures, and wherein like reference numerals refer to like parts throughout the figures unless specified otherwise.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a schematic block diagram of an unbalanced multiplexer 100 according to an embodiment of the inventive concept.

Referring to FIG. 1, the unbalanced multiplexer 100 includes a first transmission circuit 110 and a second transmission circuit 120.

The first transmission circuit 110 includes a first pull-up circuit (PU1) 111, a first pull-down circuit (PD1) 112 and a first input terminal at which a first input signal IN1 is applied. The first pull-up circuit 111 is connected between a source voltage terminal VDD and an output terminal MO. The first pull-down circuit 112 is connected between the output terminal MO and a ground voltage terminal VSS. The first input signal IN1 and a selection signal S are applied to the first pull-up circuit 111. The first input signal IN1 and an inverted selection signal /S are applied to the first pull-down circuit 112.

The second transmission circuit 120 includes a second pull-up circuit (PU2) 121, a second pull-down circuit (PD2) 122, and a second input terminal at which a second input signal IN2 is applied. The second pull-up circuit 121 is connected between the source voltage terminal VDD and the output terminal MO. The second pull-down circuit 122 is connected between the output terminal MO and the ground voltage terminal VSS. The second input signal IN2 and the inverted selection signal /S are applied to the second pull-up circuit 121. The second input signal IN2 and the selection signal S are applied to the second pull-down circuit 122.

The first input signal IN1 may be transmitted to the output terminal MO or the second input signal IN2 may be transmitted to the output terminal MO according to a logic state of the selection signal S. A delay characteristic of a first transmission path along which the first input signal IN1 of the first transmission circuit 110 is transmitted to the output terminal MO, and a delay characteristic of a second transmission path along which the second input signal IN2 of the second transmission circuit 120 is transmitted to the output terminal MO may be differently set.

For example, the first input signal IN1 may be set as a data signal, the second input signal IN2 may be set as a scan input signal, and the selection signal S may be set as a scan enable signal. The second transmission circuit 120 may be designed such that a delay time of the second transmission path along which the second input signal IN2 of the second transmission circuit 120 is transmitted to the output terminal MO is greater than that of the first transmission path along which the first input signal IN1 of the first transmission circuit 110.

For example, the first pull-up circuit 111 may include first group p-type metal-oxide-semiconductor (PMOS) transistors having a cascode structure connected between the source voltage terminal VDD and the output terminal MO, and the first pull-down circuit 112 may include second group n-type metal-oxide-semiconductor (NMOS) transistors having the cascode structure connected between the output terminal MO and the ground voltage terminal VSS. The second pull-up circuit 121 may include third group PMOS transistors having the cascode structure connected between the source voltage terminal VDD and the output terminal MO, and the second pull-down circuit 122 may include fourth group NMOS transistors having the cascode structure connected between the output terminal MO and the ground voltage terminal VSS.

For example, a scan enable signal S may be applied to a gate of one of the first group PMOS transistors, an inverted scan enable signal /S may be applied to a gate of one of the second group NMOS transistors, and a data signal may be applied to gates of the other first group PMOS transistors and the other second group NMOS transistors. The inverted scan enable signal /S may be applied to a gate of one of the third group PMOS transistors, the scan enable signal S may be applied to a gate of one of the fourth group NMOS transistors, and a scan input signal may be applied to gates of the other third group PMOS transistors and the other fourth group NMOS transistors.

Embodiments of the inventive concept may provide various schemes of designing the second pull-up circuit 121 or the second pull-down circuit 122 such that a delay time when a scan input signal of the second pull-up circuit 121 and the second pull-down circuit 122 is transmitted to the output terminal MO is greater than a delay time when a data signal of the first pull-up circuit 111 or the first pull-down circuit 112 is transmitted to the output terminal MO.

Various embodiments of the unbalanced multiplexer 100 of the inventive concepts will now be described with reference to FIGS. 2 through 10.

Figure 2:
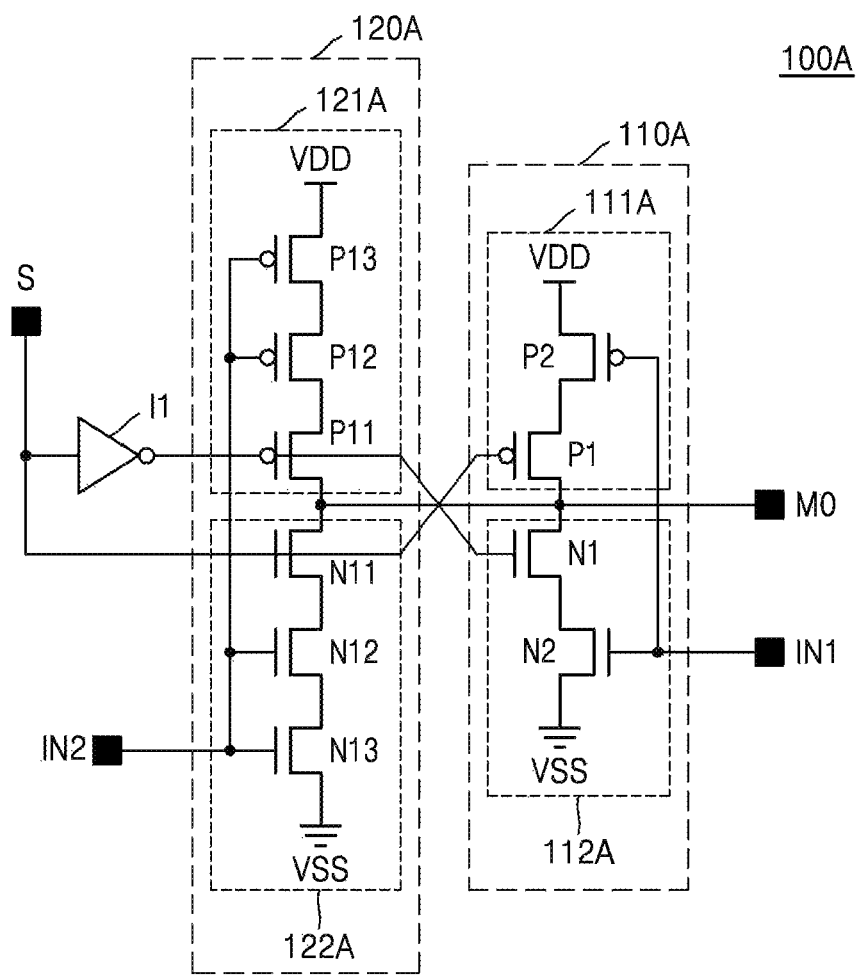
FIG. 2 illustrates a detailed circuit diagram of an example of the unbalanced multiplexer of FIG. 1.

FIG. 2 illustrates a detailed circuit diagram of an example 100A of the unbalanced multiplexer 100 of FIG. 1.

Referring to FIG. 2, the unbalanced multiplexer 100A includes a first transmission circuit 110A and a second transmission circuit 120A. The first transmission circuit 110A includes a first pull-up circuit 111A and a first pull-down circuit 112A. The second transmission circuit 120A includes a second pull-up circuit 121A and a second pull-down circuit 122A. In an embodiment of FIG. 2, an inverter I1 may be used to generate the inverted selection signal /S from the selection signal S.

First group PMOS transistors P1 and P2 included in the first pull-up circuit 111A have a cascode structure (or arrangement) and are connected between the source voltage terminal VDD and the output terminal MO. The selection signal S is applied to a gate of one of the first group PMOS transistors P1 and P2, and the first input signal IN1 is applied to a gate of another first group PMOS transistor. For example, in the embodiment as shown in FIG. 2, the selection signal S is applied to a gate of the first group PMOS transistor P1, and the first input signal IN1 is applied to a gate of the first group PMOS transistor P2. In other embodiments, the selection signal S may be applied to a gate of the first group PMOS transistor P2, and the first input signal IN1 may be applied to a gate of the first group PMOS transistor P1.

Second group NMOS transistors N1 and N2 included in the first pull-down circuit 112A have the cascode structure and are connected between the output terminal MO and the ground voltage terminal VSS. The inverted selection signal /S is applied to a gate of one of the second group NMOS transistors N1 and N2, and the first input signal IN1 is applied to a gate of another second group NMOS transistor. For example, in the embodiment as shown in FIG. 2, the inverted selection signal /S is applied to a gate of the second group NMOS transistor N1, and the first input signal IN1 may be applied to a gate of the second group NMOS transistor N2. In other embodiments, the inverted selection signal /S and the first input signal IN1 may be respectively applied to the gate of the second group NMOS transistor N2 and the gate of the second group NMOS transistor N1.

Third group PMOS transistors P11, P12, and P13 included in the second pull-up circuit 121A have the cascode structure and are connected between the source voltage terminal VDD and the output terminal MO. The inverted selection signal /S is applied to a gate of one of the third group PMOS transistors P11, P12, and P13, and the second input signal IN2 is applied to gates of the other third group PMOS transistors. For example, in the embodiment as shown in FIG. 2, the inverted selection signal /S is applied to a gate of the third group PMOS transistor P11, and the second input signal IN2 is applied to a gate of each of the third group PMOS transistors P12 and P13. In other embodiments, the inverted selection signal /S may be applied to the gate of either one of third group PMOS transistors P12 or P13, and the second input signal IN2 may be applied to the other two remaining gates of the third group PMOS transistors P11, P12 and P13.

Fourth group NMOS transistors N11, N12, and N13 included in the second pull-down circuit 122A have the cascode structure and are connected between the output terminal MO and the ground voltage terminal VSS. The selection signal S is applied to a gate of one of the fourth group NMOS transistors N11, N12, and N13, and the second input signal IN2 is applied to gates of the other fourth group NMOS transistors. For example, in the embodiment as shown in FIG. 2, the selection signal S is applied to a gate of the fourth group NMOS transistor N11, and the second input signal IN2 is applied to a gate of each of the fourth group NMOS transistors N12 and N13. In other embodiments, the selection signal S may be applied to the gate of either one of fourth group NMOS transistors N12 or N13, and the second input signal IN2 may be applied to the other two remaining gates of the fourth group NMOS transistors N11, N12 and N13.

A circuit operation according to a logic state of the selection signal S will now be described.

The PMOS transistor P1 of the first pull-up circuit 111A and the NMOS transistor N1 of the first pull-down circuit 112A are turned off when the selection signal S is in a logic high state, and the PMOS transistor P11 of the second pull-up circuit 121A and the NMOS transistor N11 of the second pull-down circuit 122A are turned on. Accordingly, the first transmission circuit 110A may be blocked, and the second input signal IN2 may be transmitted to the output terminal MO through the second transmission circuit 120A when the selection signal S is in the logic high state.

The PMOS transistor P1 of the first pull-up circuit 111A and the NMOS transistor N1 of the first pull-down circuit 112A are turned on when the selection signal S is in a logic low state, and the PMOS transistor P11 of the second pull-up circuit 121A and the NMOS transistor N11 of the second pull-down circuit 122A are turned off. Accordingly, the second transmission circuit 120A may be blocked, and the first input signal IN1 may be transmitted to the output terminal MO through the first transmission circuit 110A in the section where the selection signal S is in the logic low state.

Referring to FIG. 2, the PMOS transistors P12 and P13 having gates to which the second input signal IN2 is applied have a cascode structure and are connected between the source voltage terminal VDD and the output terminal MO in the second pull-up circuit 121A. The NMOS transistors N12 and N13 having gates to which the second input signal IN2 is applied have the cascode structure and are connected between the output terminal MO and the ground voltage terminal VSS in the second pull-down circuit 122A. That is, two transistors to which the second input signal IN2 is applied are designed as a circuit having the cascode structure in each of the second pull-up circuit 121A and the second pull-down circuit 122A.

In comparison, the first input signal IN1 is applied to a gate of the one PMOS transistor P2 in the first pull-up circuit 111A. The first input signal IN1 is also applied to a gate of the one NMOS transistor N2 in the first pull-down circuit 112A.

Accordingly, one transistor to which the second input signal IN2 is applied is added, in the cascode structure, to each of the second pull-up circuit 121A and the second pull-down circuit 122A of the second transmission circuit 120A to which the second input signal IN2 is transmitted, rather than being added to the first transmission circuit 110A to which the first input signal IN1 is transmitted.

As described above, a transistor is added to a second transmission path along which the second input signal IN2 is transmitted to the output terminal MO, rather than a first transmission path along which the first input signal IN1 is transmitted to the output terminal MO, and thus a current of the second transmission path may be reduced. Accordingly, a delay time with respect to the second transmission path may be greater than a delay time with respect to the first transmission path. In particular, a delay time difference between the second transmission path and the first transmission path may further increase at the low source voltage.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100A of FIG. 2 may be stably performed based on a delay time difference between the data signal and the scan signal. This will be described with reference to FIGS. 11 through 16.

Figure 3:
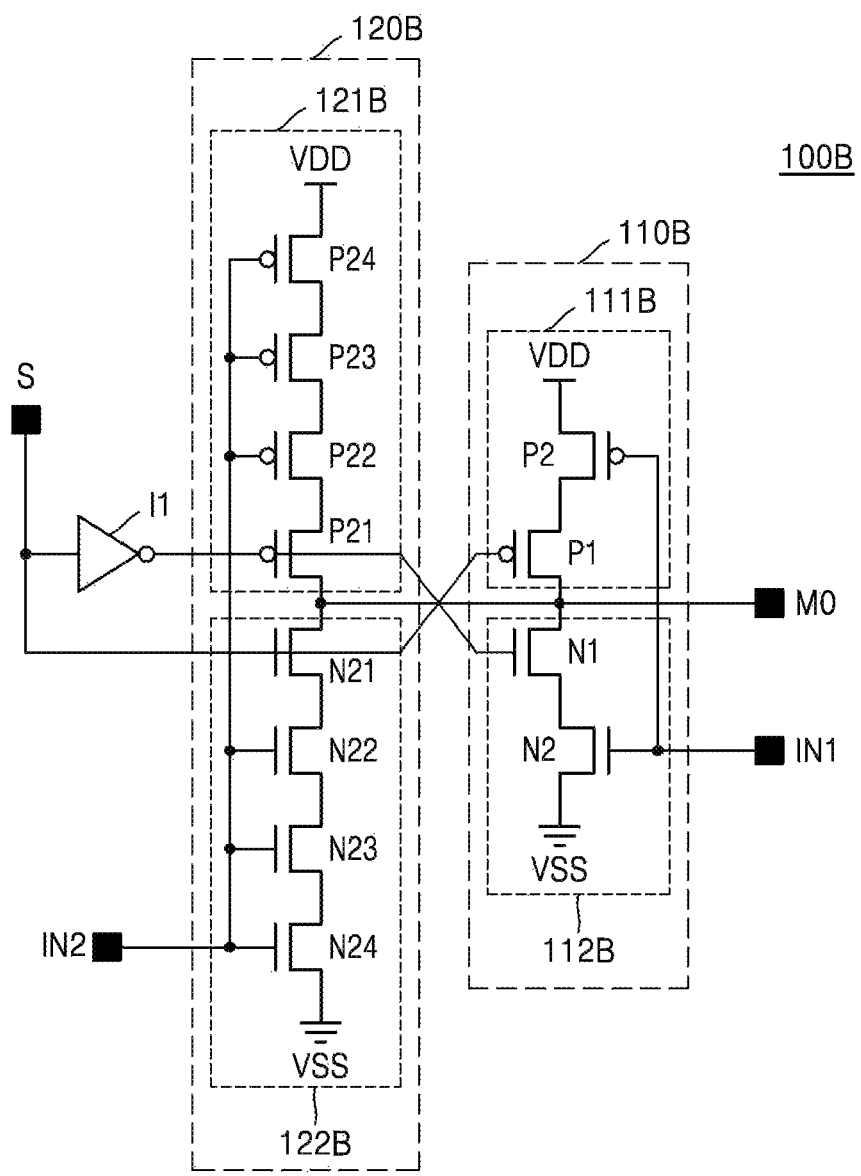
FIG. 3 illustrates a detailed circuit diagram of another example of the unbalanced multiplexer of FIG. 1.

FIG. 3 illustrates a detailed circuit diagram of another example 100B of the unbalanced multiplexer 100 of FIG. 1.

Referring to FIG. 3, the unbalanced multiplexer 100B includes a first transmission circuit 110B and a second transmission circuit 120B. The first transmission circuit 110B includes a first pull-up circuit 111B and a first pull-down circuit 112B. The second transmission circuit 120B includes a second pull-up circuit 121B and a second pull-down circuit 122B. In an embodiment of FIG. 3, the inverter I1 may be used to generate the inverted selection signal /S from the selection signal S.

The first transmission circuit 110B of FIG. 3 is substantially the same as the first transmission circuit 110A of FIG. 2, and thus redundant description of the first transmission circuit 110B will be avoided.

Configuration of the second transmission circuit 120B will be described.

Third group PMOS transistors P21, P22, P23, and P24 included in the second pull-up circuit 121B have a cascode structure and are connected between the source voltage terminal VDD and the output terminal MO. The inverted selection signal /S is applied to a gate of one of the third group PMOS transistors P21, P22, P23, and P24, and the second input signal IN2 is applied to gates of the other third group PMOS transistors. For example, in the embodiment as shown in FIG. 3, the inverted selection signal /S is applied to a gate of the third group PMOS transistor P21, and the second input signal IN2 is applied to a gate of each of the third group PMOS transistors P22, P23, and P24. In other embodiments, the inverted selection signal /S may be applied to the gate of either one of third group PMOS transistors P22, P23 or P24, and the second input signal IN2 may be applied to the other three remaining gates of the third group PMOS transistors P21, P22, P23 and P24.

Fourth group NMOS transistors N21, N22, N23, and N24 included in the second pull-down circuit 122B have the cascode structure and are connected between the output terminal MO and the ground voltage VSS. The selection signal S is applied to a gate of one of the fourth group NMOS transistors N21, N22, N23, and N24, and the second input signal IN2 is applied to gates of the other fourth group NMOS transistors. For example, in the embodiment as shown in FIG. 3, the selection signal S is applied to a gate of the fourth group NMOS transistor N21, and the second input signal IN2 is applied to a gate of each of the fourth group NMOS transistors N22, N23, and N24. In other embodiments, the selection signal S may be applied to the gate of either one of fourth group NMOS transistors N22, N23 or N24, and the second input signal IN2 is applied to the other three remaining gates of the fourth group NMOS transistors N21, N22, N23 and N24.

A circuit operation according to a logic state of the selection signal S will now be described.

The PMOS transistor P1 of the first pull-up circuit 111B and the NMOS transistor N1 of the first pull-down circuit 112B are turned off when the selection signal S is in a logic high state, and the PMOS transistor P21 of the second pull-up circuit 121B and the NMOS transistor N21 of the second pull-down circuit 122B are turned on. Accordingly, the first transmission circuit 110B may be blocked, and the second input signal IN2 may be transmitted to the output terminal MO through the second transmission circuit 120B when the selection signal S is in the logic high state.

The PMOS transistor P1 of the first pull-up circuit 111B and the NMOS transistor N1 of the first pull-down circuit 112B are turned on when the selection signal S is in a logic low state, and the PMOS transistor P21 of the second pull-up circuit 121B and the NMOS transistor N21 of the second pull-down circuit 122B are turned off. Accordingly, the second transmission circuit 120B may be blocked, and the first input signal IN1 may be transmitted to the output terminal MO through the first transmission circuit 110B when the selection signal S is in the logic low state.

Referring to FIG. 3, the PMOS transistors P22, P23, and P24 having gates to which the second input signal IN2 is applied have a cascode structure and are connected between the source voltage terminal VDD and the output terminal MO in the second pull-up circuit 121B. The NMOS transistors N22, N23, and N24 having gates to which the second input signal IN2 is applied have the cascode structure and are connected between the output terminal MO and the ground voltage terminal VSS in the second pull-down circuit 122B. That is, three transistors to which the second input signal IN2 is applied may be designed as a circuit having the cascode structure in each of the second pull-up circuit 121B and the second pull-down circuit 122B.

In comparison, the first input signal IN1 is applied to a gate of the one PMOS transistor P2 in the first pull-up circuit 111B. The first input signal IN1 is also applied to a gate of the one NMOS transistor N2 in the first pull-down circuit 112B.

Accordingly, two transistors to which the second input signal IN2 is applied are added, in the cascode structure, to each of the second pull-up circuit 121B and the second pull-down circuit 122B of the second transmission circuit 120B to which the second input signal IN2 is transmitted, rather than being added to the first transmission circuit 110B to which the first input signal IN1 is transmitted.

As described above, transistors are added to a second transmission path along which the second input signal IN2 is transmitted to the output terminal MO, rather than a first transmission path along which the first input signal IN1 is transmitted to the output terminal MO, and thus a current of the second transmission path may be reduced. Accordingly, a delay time with respect to the second transmission path may be greater than a delay time with respect to the first transmission path. In particular, a delay time difference between the second transmission path and the first transmission path may further increase at the low source voltage.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100B of FIG. 3 may be stably performed based on a delay time difference between the data signal and the scan signal. This will be described with reference to FIGS. 11 through 16.

In an embodiment of FIG. 3, three transistors to which the second input signal IN2 is applied and having the cascode structure are disposed in each of the second pull-up circuit 121B and the second pull-down circuit 122B of the second transmission circuit 120B.

In another embodiment, in order to further increase a delay time in the second transmission circuit 120B, four or more transistors to which the second input signal IN2 is applied and having the cascode structure may be disposed in each of the second pull-up circuit 121B and the second pull-down circuit 122B of the second transmission circuit 120B.

Figure 4:
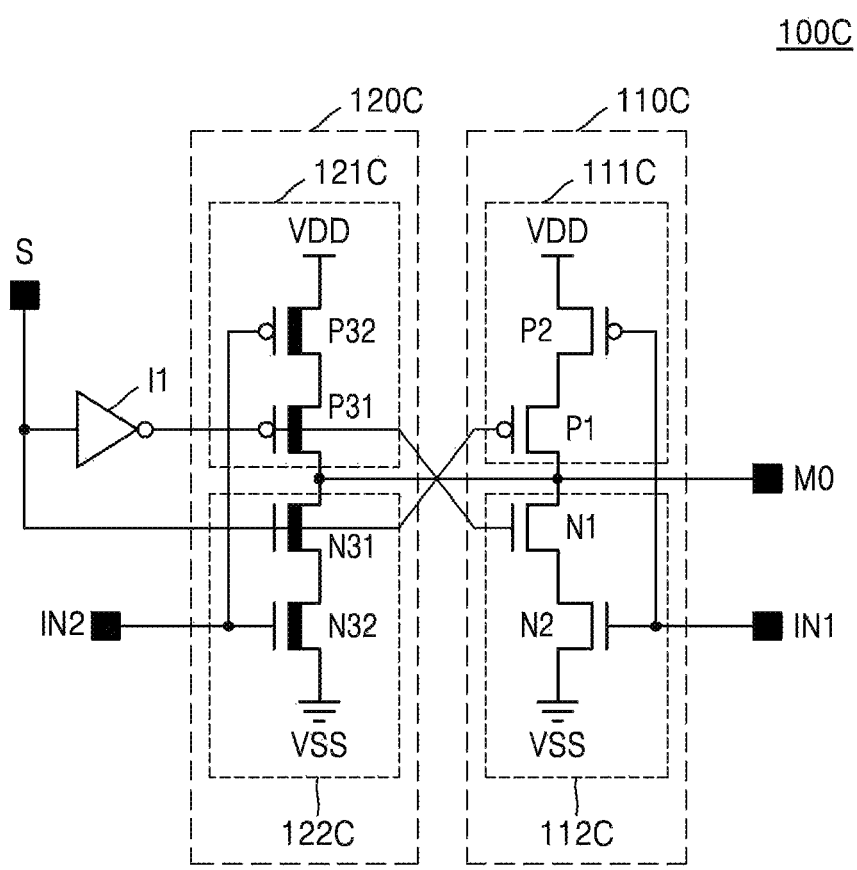
FIG. 4 illustrates a detailed circuit diagram of another example of the unbalanced multiplexer of FIG. 1.

FIG. 4 illustrates a detailed circuit diagram of another example 100C of the unbalanced multiplexer 100 of FIG. 1.

Referring to FIG. 4, the unbalanced multiplexer 100C includes a first transmission circuit 110C and a second transmission circuit 120C. The first transmission circuit 110C includes a first pull-up circuit 111C and a first pull-down circuit 112C. The second transmission circuit 120C includes a second pull-up circuit 121C and a second pull-down circuit 122C. In an embodiment of FIG. 4, the inverter I1 may be used to generate the inverted selection signal /S from the selection signal S.

The first transmission circuit 110C of FIG. 4 is substantially the same as the first transmission circuit 110A of FIG. 2, and thus redundant description of the first transmission circuit 110C will be avoided.

A configuration of the second transmission circuit 120C will be described.

Third group PMOS transistors P31 and P32 included in the second pull-up circuit 121C have a cascode structure and are connected between the source voltage terminal VDD and the output terminal MO. The inverted selection signal /S is applied to a gate of one of the third group PMOS transistors P31 and P32, and the second input signal IN2 is applied to a gate of the other third group PMOS transistor. For example, in the embodiment of FIG. 4, the inverted selection signal /S is applied to a gate of the third group PMOS transistor P31, and the second input signal IN2 is applied to a gate of the third group PMOS transistor P32. In other embodiments, the inverted selection signal /S may be applied to a gate of the third group PMOS transistor P32, and the second input signal IN2 may be applied to a gate of the third group PMOS transistor P31.

Fourth group NMOS transistors N31 and N32 included in the second pull-down circuit 122C have the cascode structure and are connected between the output terminal MO and the ground voltage terminal VSS. The selection signal S is applied to a gate of one of the fourth group NMOS transistors N31 and N32, and the second input signal IN2 is applied to a gate of the other fourth group NMOS transistor. For example, in the embodiment of FIG. 4, the selection signal S is applied to a gate of the fourth group NMOS transistor N31, and the second input signal IN2 is applied to a gate of the fourth group NMOS transistor N32. In other embodiments, the selection signal S may be applied to a gate of the fourth group NMOS transistor N32, and the second input signal IN2 may be applied to a gate of the fourth group NMOS transistor N31.

A circuit operation according to a logic state of the selection signal S will now be described.

The PMOS transistor P1 of the first pull-up circuit 111C and the NMOS transistor N1 of the first pull-down circuit 112C are turned off when the selection signal S is in a logic high state, and the PMOS transistor P31 of the second pull-up circuit 121C and the NMOS transistor N31 of the second pull-down circuit 122C are turned on. Accordingly, the first transmission circuit 110C may be blocked, and the second input signal IN2 may be transmitted to the output terminal MO through the second transmission circuit 120C when the selection signal S is in the logic high state.

The PMOS transistor P1 of the first pull-up circuit 111C and the NMOS transistor N1 of the first pull-down circuit 112C are turned on when the selection signal S is in a logic low state, and the PMOS transistor P31 of the second pull-up circuit 121C and the NMOS transistor N31 of the second pull-down circuit 122C are turned off. Accordingly, the second transmission circuit 120C may be blocked, and the first input signal IN1 may be transmitted to the output terminal MO through the first transmission circuit 110C when the selection signal S is in the logic low state.

As shown in FIG. 4, the number of transistors to which the first input signal IN1 is applied in the first transmission circuit 110C is the same as the number of transistors to which the second input signal IN2 is applied in the second transmission circuit 120C.

However, gate lengths of the PMOS transistors P31 and P32 and the NMOS transistors N31 and N32 that are included in the second transmission circuit 120C are designed to be greater than gate lengths of the PMOS transistors P1 and P2 and the NMOS transistors N1 and N2 that are included in the first transmission circuit 110C. This is indicated in FIG. 4 whereby PMOS transistors P31 and P32 and NMOS transistors N31 and N32 are shown as having thicker, bolder sections under the gate electrodes. Accordingly, a delay time with respect to a second transmission path is greater than a delay time with respect to a first transmission path.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100C of FIG. 4 may be stably performed based on a delay time difference between the data signal and the scan signal. This will be described with reference to FIGS. 11 through 16.

Figure 5:
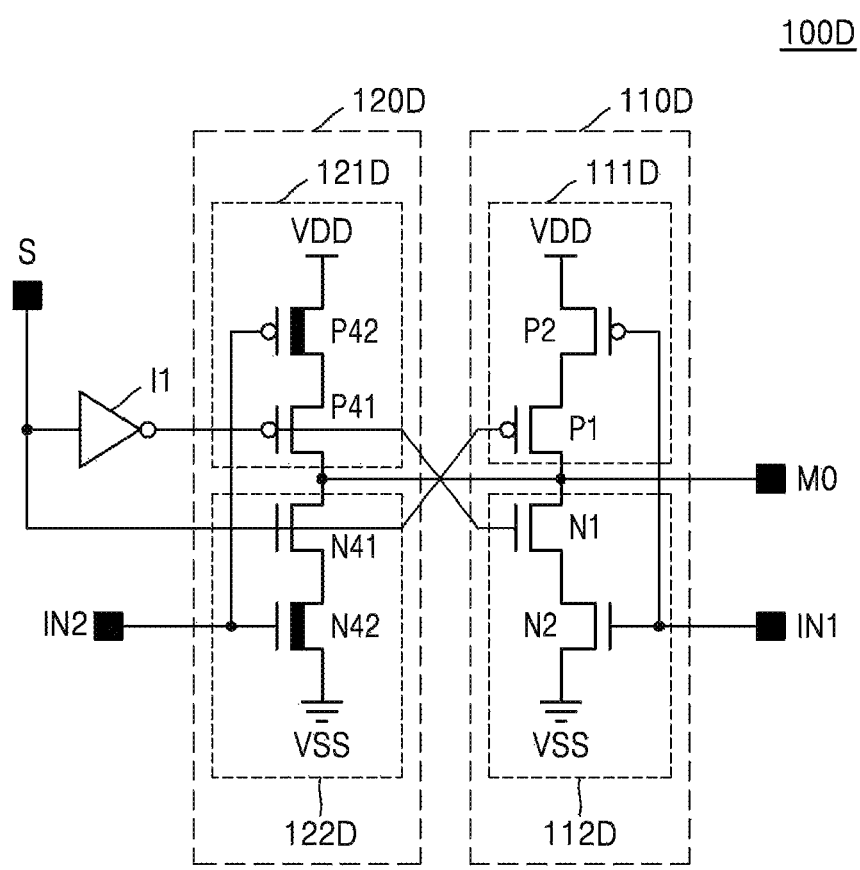
FIG. 5 illustrates a detailed circuit diagram of another example of the unbalanced multiplexer of FIG. 1.

FIG. 5 illustrates a detailed circuit diagram of another example 100D of the unbalanced multiplexer 100 of FIG. 1.

Referring to FIG. 5, the unbalanced multiplexer 100D includes a first transmission circuit 110D and a second transmission circuit 120D. The first transmission circuit 110D includes a first pull-up circuit 111D and a first pull-down circuit 112D. The second transmission circuit 120D includes a second pull-up circuit 121D and a second pull-down circuit 122D. In an embodiment of FIG. 5, the inverter I1 may be used to generate the inverted selection signal /S from the selection signal S.

The first transmission circuit 110D of FIG. 5 is substantially the same as the first transmission circuit 110A of FIG. 2, and thus redundant description of the first transmission circuit 110D will be avoided.

A configuration of the second transmission circuit 120D will be described.

Third group PMOS transistors P41 and P42 included in the second pull-up circuit 121D have a cascode structure and are connected between the source voltage terminal VDD and the output terminal MO. The inverted selection signal /S is applied to a gate of one of the third group PMOS transistors P41 and P42, and the second input signal IN2 is applied to a gate of the other third group PMOS transistor. For example, in the embodiment of FIG. 5, the inverted selection signal /S is applied to a gate of the third group PMOS transistor P41, and the second input signal IN2 is applied to a gate of the third group PMOS transistor P42. In other embodiments, the inverted selection signal /S may be applied to a gate of the third group PMOS transistor P42, and the second input signal IN2 may be applied to a gate of the third group PMOS transistor P41.

Fourth group NMOS transistors N41 and N42 included in the second pull-down circuit 122D have the cascode structure and are connected between the output terminal MO and the ground voltage terminal VSS. The selection signal S is applied to a gate of one of the fourth group NMOS transistors N41 and N42, and the second input signal IN2 is applied to a gate of the other fourth group NMOS transistor. For example, in the embodiment of FIG. 5, the selection signal S is applied to a gate of the fourth group NMOS transistor N41, and the second input signal IN2 is applied to a gate of the fourth group NMOS transistor N42. In other embodiments, the selection signal S may be applied to a gate of the fourth group NMOS transistor N42, and the second input signal IN2 may be applied to a gate of the fourth group NMOS transistor N41.

A circuit operation according to a logic state of the selection signal S will now be described.

The PMOS transistor P1 of the first pull-up circuit 111D and the NMOS transistor N1 of the first pull-down circuit 112D are turned off when the selection signal S is in a logic high state, and the PMOS transistor P41 of the second pull-up circuit 121D and the NMOS transistor N41 of the second pull-down circuit 122D are turned on. Accordingly, the first transmission circuit 110D may be blocked, and the second input signal IN2 may be transmitted to the output terminal MO through the second transmission circuit 120D when the selection signal S is in the logic high state.

The PMOS transistor P1 of the first pull-up circuit 111D and the NMOS transistor N1 of the first pull-down circuit 112D are turned on when the selection signal S is in a logic low state, and the PMOS transistor P41 of the second pull-up circuit 121D and the NMOS transistor N41 of the second pull-down circuit 122D are turned off. Accordingly, the second transmission circuit 120D may be blocked, and the first input signal IN1 may be transmitted to the output terminal MO through the first transmission circuit 110D when the selection signal S is in the logic low state.

As shown in FIG. 5, the number of transistors to which the first input signal IN1 is applied in the first transmission circuit 110D is the same as the number of transistors to which the second input signal IN2 is applied in the second transmission circuit 120D.

However, gate lengths of some of the PMOS transistors P41 and P42 and the NMOS transistors N41 and N42 that are included in the second transmission circuit 120D are designed to be greater than gate lengths of the PMOS transistors P1 and P2 and the NMOS transistors N1 and N2 that are included in the first transmission circuit 110D. For example, gate lengths of the PMOS transistor P42 and the NMOS transistor N42 that are included in the second transmission circuit 120D are designed to be greater than gate lengths of the PMOS transistors P1 and P2 and the NMOS transistors N1 and N2 that are included in the first transmission circuit 110D. Accordingly, a delay time with respect to a second transmission path may be greater than a delay time with respect to a first transmission path. In other embodiments, gate lengths of the PMOS transistor P41 and the NMOS transistor N41 instead of the PMOS transistor P42 and the NMOS transistor N42 may be designed to be greater than gate lengths of the PMOS transistors P1 and P2 and the NMOS transistors N1 and N2.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100D of FIG. 5 may be stably performed based on a delay time difference between the data signal and the scan signal. This will be described with reference to FIGS. 11 through 16.

Figure 6:
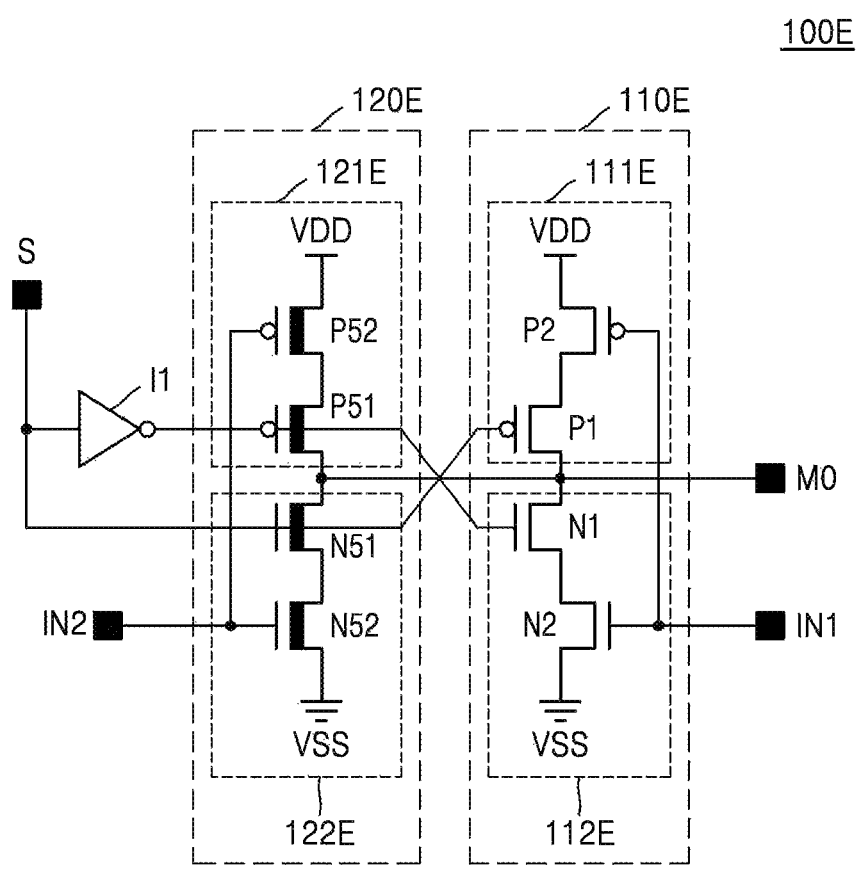
FIG. 6 illustrates a detailed circuit diagram of another example of the unbalanced multiplexer of FIG. 1.

FIG. 6 illustrates a detailed circuit diagram of another example 100E of the unbalanced multiplexer 100 of FIG. 1.

Referring to FIG. 6, the unbalanced multiplexer 100E includes a first transmission circuit 110E and a second transmission circuit 120E. The first transmission circuit 110E includes a first pull-up circuit 111E and a first pull-down circuit 112E. The second transmission circuit 120E includes a second pull-up circuit 121E and a second pull-down circuit 122E. In an embodiment of FIG. 6, the inverter I1 may be used to generate the inverted selection signal /S from the selection signal S.

The first transmission circuit 110E of FIG. 6 is substantially the same as the first transmission circuit 110A of FIG. 2, and thus redundant description of the first transmission circuit 110E will be avoided.

A configuration of the second transmission circuit 120E will be described.

Third group PMOS transistors P51 and P52 included in the second pull-up circuit 121E have a cascode structure and are connected between the source voltage terminal VDD and the output terminal MO. The inverted selection signal /S is applied to a gate of one of the third group PMOS transistors P51 and P52, and the second input signal IN2 is applied to a gate of the other third group PMOS transistor. For example, in the embodiment of FIG. 6, the inverted selection signal /S is applied to a gate of the third group PMOS transistor P51, and the second input signal IN2 is applied to a gate of the third group PMOS transistor P52. In other embodiments, the inverted selection signal /S may be applied to a gate of the third group PMOS transistor P52, and the second input signal IN2 may be applied to a gate of the third group PMOS transistor P51.

Fourth group NMOS transistors N51 and N52 included in the second pull-down circuit 122E have the cascode structure and are connected between the output terminal MO and the ground voltage terminal VSS. The selection signal S is applied to a gate of one of the fourth group NMOS transistors N51 and N52, and the second input signal IN2 is applied to a gate of the other fourth group NMOS transistor. For example, in the embodiment of FIG. 6, the selection signal S is applied to a gate of the fourth group NMOS transistor N51, and the second input signal IN2 is applied to a gate of the fourth group NMOS transistor N52. In other embodiments, the selection signal S may be applied to a gate of the fourth group NMOS transistor N52, and the second input signal IN2 may be applied to a gate of the fourth group NMOS transistor N51.

A circuit operation according to a logic state of the selection signal S will now be described.

The PMOS transistor P1 of the first pull-up circuit 111E and the NMOS transistor N1 of the first pull-down circuit 112E are turned off when the selection signal S is in a logic high state, and the PMOS transistor P51 of the second pull-up circuit 121E and the NMOS transistor N51 of the second pull-down circuit 122E are turned on. Accordingly, the first transmission circuit 110E may be blocked, and the second input signal IN2 may be transmitted to the output terminal MO through the second transmission circuit 120E when the selection signal S is in the logic high state.

The PMOS transistor P1 of the first pull-up circuit 111E and the NMOS transistor N1 of the first pull-down circuit 112E are turned on when the selection signal S is in a logic low state, and the PMOS transistor P51 of the second pull-up circuit 121E and the NMOS transistor N51 of the second pull-down circuit 122E are turned off. Accordingly, the second transmission circuit 120E may be blocked, and the first input signal IN1 may be transmitted to the output terminal MO through the first transmission circuit 110E when the selection signal S is in the logic low state.

As shown in FIG. 6, the number of transistors to which the first input signal IN1 is applied in the first transmission circuit 110E is the same as the number of transistors to which the second input signal IN2 is applied in the second transmission circuit 120E.

However, threshold voltages of the PMOS transistors P51 and P52 and the NMOS transistors N51 and N52 that are included in the second transmission circuit 120E are designed to be higher than threshold voltages of the PMOS transistors P1 and P2 and the NMOS transistors N1 and N2 that are included in the first transmission circuit 110E. This is indicated in FIG. 6 whereby PMOS transistors P51 and P52 and NMOS transistors N51 and N52 are shown as having thicker, bolder sections under the gate electrodes. For example, the threshold voltages of the PMOS transistors P51 and P52 and the NMOS transistors N51 and N52 that are included in the second transmission circuit 120E may be designed to be higher than the threshold voltages of the PMOS transistors P1 and P2 and the NMOS transistors N1 and N2 that are included in the first transmission circuit 110E by adjusting channel doping concentration of the PMOS transistors P51 and P52 and the NMOS transistors N51 and N52 during a manufacturing process. As another example, the threshold voltages of the PMOS transistors P51 and P52 and the NMOS transistors N51 and N52 that are included in the second transmission circuit 120E may be designed to be higher than the threshold voltages of the PMOS transistors P1 and P2 and the NMOS transistors N1 and N2 that are included in the first transmission circuit 110E by adjusting work functions of the PMOS transistors P51 and P52 and the NMOS transistors N51 and N52 during the manufacturing process. Accordingly, a delay time with respect to a second transmission path may be greater than a delay time with respect to a first transmission path.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100E of FIG. 6 may be stably performed based on a delay time difference between the data signal and the scan signal. This will be described with reference to FIGS. 11 through 16.

Figure 7:
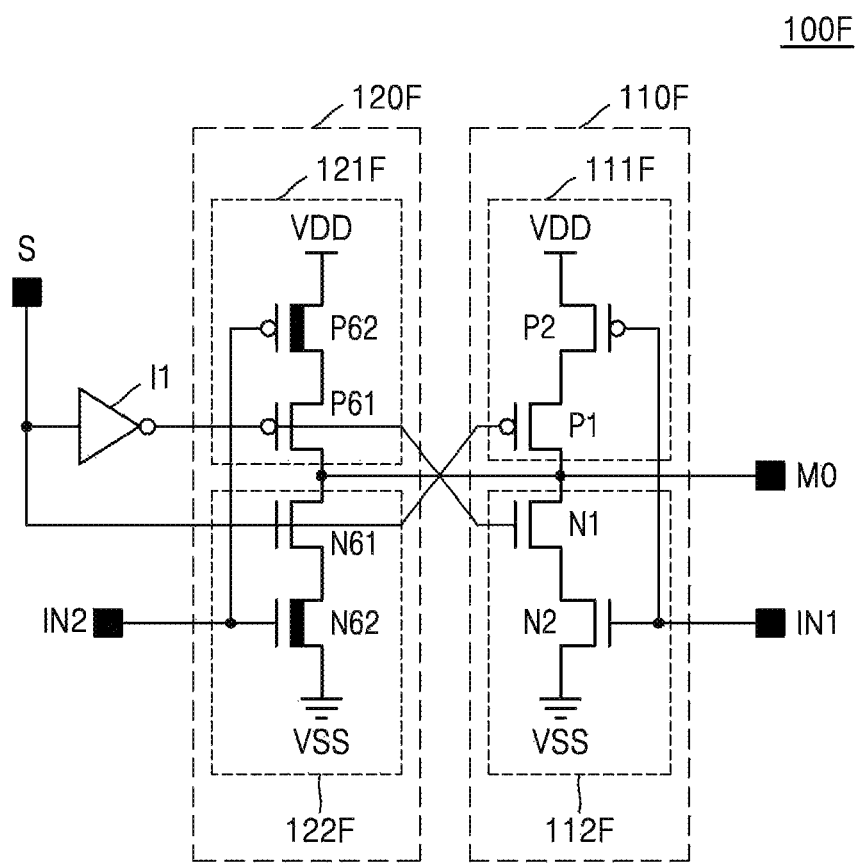
FIG. 7 illustrates a detailed circuit diagram of another example of the unbalanced multiplexer of FIG. 1.

FIG. 7 illustrates a detailed circuit diagram of another example 100F of the unbalanced multiplexer 100 of FIG. 1.

Referring to FIG. 7, the unbalanced multiplexer 100F includes a first transmission circuit 110F and a second transmission circuit 120F. The first transmission circuit 110F includes a first pull-up circuit 111F and a first pull-down circuit 112F. The second transmission circuit 120F includes a second pull-up circuit 121F and a second pull-down circuit 122F. In an embodiment of FIG. 7, the inverter I1 may be used to generate the inverted selection signal /S from the selection signal S.

The first transmission circuit 110F of FIG. 7 is substantially the same as the first transmission circuit 110A of FIG. 2, and thus redundant description of the first transmission circuit 110F will be avoided.

A configuration of the second transmission circuit 120F will be described.

Third group PMOS transistors P61 and P62 included in the second pull-up circuit 121F have a cascode structure and are connected between the power voltage VDD and the output terminal MO. The inverted selection signal /S is applied to a gate of one of the third group PMOS transistors P61 and P62, and the second input signal IN2 is applied to a gate of the other third group PMOS transistor. For example, in the embodiment of FIG. 7, the inverted selection signal /S is applied to a gate of the third group PMOS transistor P61, and the second input signal IN2 is applied to a gate of the third group PMOS transistor P62. In other embodiments, the inverted selection signal /S may be applied to a gate of the third group PMOS transistor P62, and the second input signal IN2 may be applied to a gate of the third group PMOS transistor P61.

Fourth group NMOS transistors N61 and N62 included in the second pull-down circuit 122F have the cascode structure and are connected between the output terminal MO and the ground voltage terminal VSS. The selection signal S is applied to a gate of one of the fourth group NMOS transistors N61 and N62, and the second input signal IN2 is applied to a gate of the other fourth group NMOS transistor. For example, in the embodiment of FIG. 7, the selection signal S is applied to a gate of the fourth group NMOS transistor N61, and the second input signal IN2 is applied to a gate of the fourth group NMOS transistor N62. In other embodiments, the selection signal S may be applied to a gate of the fourth group NMOS transistor N62, and the second input signal IN2 may be applied to a gate of the fourth group NMOS transistor N61.

A circuit operation according to a logic state of the selection signal S will now be described.

The PMOS transistor P1 of the first pull-up circuit 111F and the NMOS transistor N1 of the first pull-down circuit 112F are turned off when the selection signal S is in a logic high state, and the PMOS transistor P61 of the second pull-up circuit 121F and the NMOS transistor N61 of the second pull-down circuit 122F are turned on. Accordingly, the first transmission circuit 110F may be blocked, and the second input signal IN2 may be transmitted to the output terminal MO through the second transmission circuit 120F when the selection signal S is in the logic high state.

The PMOS transistor P1 of the first pull-up circuit 111F and the NMOS transistor N1 of the first pull-down circuit 112F are turned on when the selection signal S is in a logic low state, and the PMOS transistor P61 of the second pull-up circuit 121F and the NMOS transistor N61 of the second pull-down circuit 122F are turned off. Accordingly, the second transmission circuit 120F may be blocked, and the first input signal IN1 may be transmitted to the output terminal MO through the first transmission circuit 110F when the selection signal S is in the logic low state.

As shown in FIG. 7, the number of transistors to which the first input signal IN1 is applied in the first transmission circuit 110F is the same as the number of transistors to which the second input signal IN2 is applied in the second transmission circuit 120F.

However, threshold voltages of some of the PMOS transistors P61 and P62 and the NMOS transistors N61 and N62 that are included in the second transmission circuit 120F are designed to be higher than threshold voltages of the PMOS transistors P1 and P2 and the NMOS transistors N1 and N2 that are included in the first transmission circuit 110F. For example, the threshold voltages of the PMOS transistor P62 and the NMOS transistor N62 are designed to be higher than the threshold voltages of the PMOS transistors P1 and P2 and the NMOS transistors N1 and N2 that are included in the first transmission circuit 110F by adjusting channel doping concentration of the PMOS transistor P62 and the NMOS transistor N62 during a manufacturing process. As another example, the threshold voltages of the PMOS transistor P62 and the NMOS transistor N62 may be designed to be higher than the threshold voltages of the PMOS transistors P1 and P2 and the NMOS transistors N1 and N2 that are included in the first transmission circuit 110F by adjusting work functions of the PMOS transistor P62 and the NMOS transistor N62 during the manufacturing process. Accordingly, a delay time with respect to a second transmission path may be greater than a delay time with respect to a first transmission path. In other embodiments, threshold voltages of the PMOS transistor P61 and the NMOS transistor N61 instead of the PMOS transistor P62 and the NMOS transistor N62 may be designed to be greater than threshold voltages of the PMOS transistors P1 and P2 and the NMOS transistors N1 and N2.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100F of FIG. 7 may be stably performed based on a delay time difference between the data signal and the scan signal. This will be described with reference to FIGS. 11 through 16.

Figure 8:
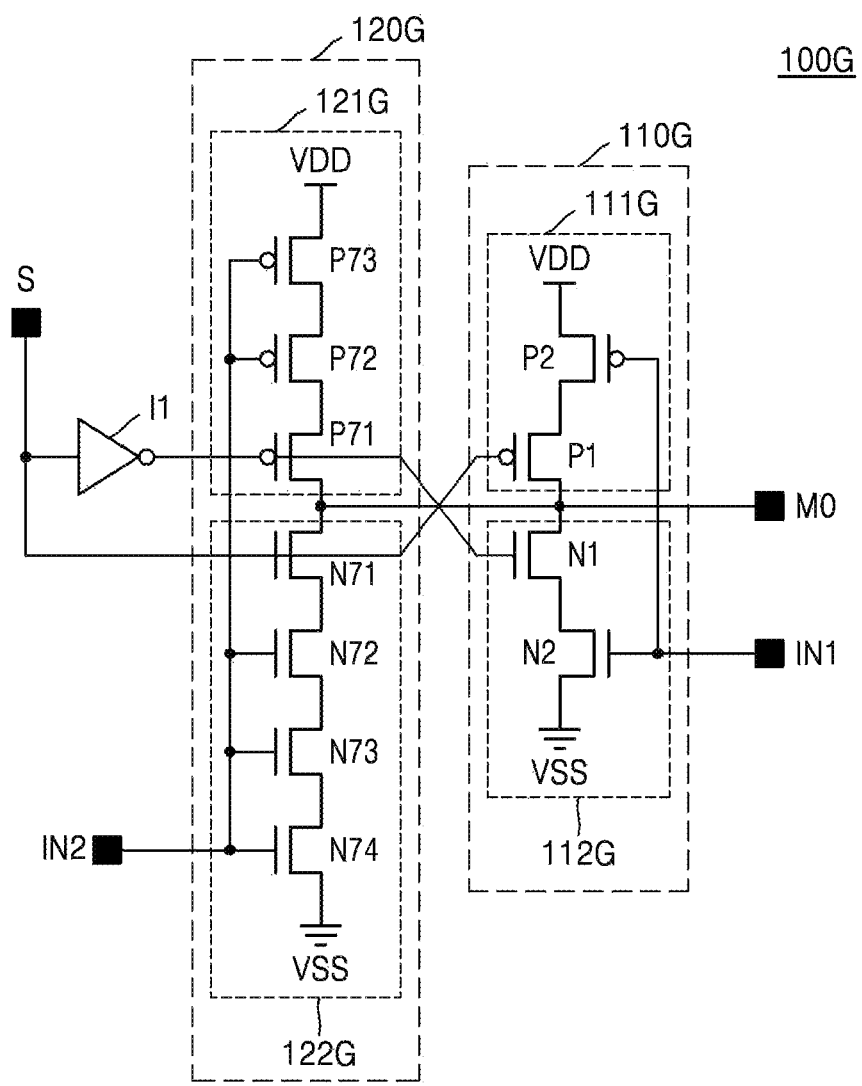
FIG. 8 illustrates a detailed circuit diagram of another example of the unbalanced multiplexer of FIG. 1.

FIG. 8 illustrates a detailed circuit diagram of another example 100G of the unbalanced multiplexer 100 of FIG. 1.

Referring to FIG. 8, the unbalanced multiplexer 100G includes a first transmission circuit 110G and a second transmission circuit 120G. The first transmission circuit 110G includes a first pull-up circuit 111G and a first pull-down circuit 112G. The second transmission circuit 120G includes a second pull-up circuit 121G and a second pull-down circuit 122G. In an embodiment of FIG. 8, the inverter I1 may be used to generate the inverted selection signal /S from the selection signal S.

The first transmission circuit 110G of FIG. 8 is substantially the same as the first transmission circuit 110A of FIG. 2, and thus redundant description of the first transmission circuit 110G will be avoided.

A configuration of the second transmission circuit 120G will be described.

Third group PMOS transistors P71, P72, and P73 included in the second pull-up circuit 121G have a cascode structure and are connected between the source voltage VDD and the output terminal MO. The inverted selection signal /S is applied to a gate of one of the third group PMOS transistors P71, P72, and P73, and the second input signal IN2 is applied to gates of the other third group PMOS transistors. For example, in the embodiment of FIG. 8, the inverted selection signal /S is applied to a gate of the third group PMOS transistor P71, and the second input signal IN2 is applied to a gate of each of the third group PMOS transistors P72 and P73. In other embodiments, the inverted selection signal /S may be applied to the gate of either one of third group PMOS transistors P72 or P73, and the second input signal IN2 may be applied to the other two remaining gates of the third group PMOS transistors P71, P72 and P73.

Fourth group NMOS transistors N71, N72, N73, and N74 included in the second pull-down circuit 122G have the cascode structure and are connected between the output terminal MO and the ground voltage VSS. The selection signal S is applied to a gate of one of the fourth group NMOS transistors N71, N72, N73, and N74, and the second input signal IN2 is applied to gates of the other fourth group NMOS transistors. For example, in the embodiment of FIG. 8, the selection signal S is applied to a gate of the fourth group NMOS transistor N71, and the second input signal IN2 is applied to a gate of each of the fourth group NMOS transistors N72, N73, and N74. In other embodiments, the selection signal S may be applied to the gate of either one of fourth group NMOS transistors N72, N73 or N74, and the second input signal IN2 may be applied to the other three remaining gates of the fourth group NMOS transistors N71, N72, N73 and N74.

A circuit operation according to a logic state of the selection signal S will now be described.

The PMOS transistor P1 of the first pull-up circuit 111G and the NMOS transistor N1 of the first pull-down circuit 112G are turned off when the selection signal S is in a logic high state, and the PMOS transistor P71 of the second pull-up circuit 121G and the NMOS transistor N71 of the second pull-down circuit 122G are turned on. Accordingly, the first transmission circuit 110G may be blocked, and the second input signal IN2 may be transmitted to the output terminal MO through the second transmission circuit 120G when the selection signal S is in the logic high state.

The PMOS transistor P1 of the first pull-up circuit 111G and the NMOS transistor N1 of the first pull-down circuit 112G are turned on when the selection signal S is in a logic low state, and the PMOS transistor P71 of the second pull-up circuit 121G and the NMOS transistor N71 of the second pull-down circuit 122G are turned off. Accordingly, the second transmission circuit 120G may be blocked, and the first input signal IN1 may be transmitted to the output terminal MO through the first transmission circuit 110G when the selection signal S is in the logic low state.

As shown in FIG. 8, the PMOS transistors P72 and P73 having gates to which the second input signal IN2 is applied have the cascode structure and are connected between the source voltage terminal VDD and the output terminal MO in the second pull-up circuit 121G. The NMOS transistors N72, N73, and N74 having gates to which the second input signal IN2 is applied have the cascode structure and are connected between the output terminal MO and the ground voltage VSS in the second pull-down circuit 122G. That is, two transistors to which the second input signal IN2 is applied are connected in the cascode structure in the second pull-up circuit 121G, and three transistors to which the second input signal IN2 is applied are connected in the cascode structure in the second pull-down circuit 122G. Accordingly, a transistor stack structure of the second pull-up circuit 121G and a transistor stack structure of the second pull-down circuit 122G have an asymmetrical shape for delay processing of the second input signal IN2.

In comparison, the first input signal IN1 is applied to the gate of the one PMOS transistor P2 in the first pull-up circuit 111G. The first input signal IN1 is applied to the gate of the one NMOS transistor N2 in the first pull-down circuit 112G.

Referring to FIG. 8, one transistor to which the second input signal IN2 is applied is added in the cascode structure of the second pull-up circuit 121G of the second transmission circuit 120G to which the second input signal IN2 is transmitted, and two transistors to which the second input signal IN2 is applied and having the cascode structure are added to the second pull-down circuit 122G, rather than being added to the first transmission circuit 110G to which the first input signal IN1 is transmitted.

As described above, transistors are added to a second transmission path along which the second input signal IN2 is transmitted to the output terminal MO, rather than a first transmission path along which the first input signal IN1 is transmitted to the output terminal MO, and thus a current of the second transmission path may be reduced. Accordingly, a delay time with respect to the second transmission path may be greater than a delay time with respect to the first transmission path. In particular, a delay time difference between the second transmission path and the first transmission path may further increase at the low source voltage.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100G of FIG. 8 may be stably performed based on a delay time difference between the data signal and the scan signal. This will be described with reference to FIGS. 11 through 16.

Figure 9:
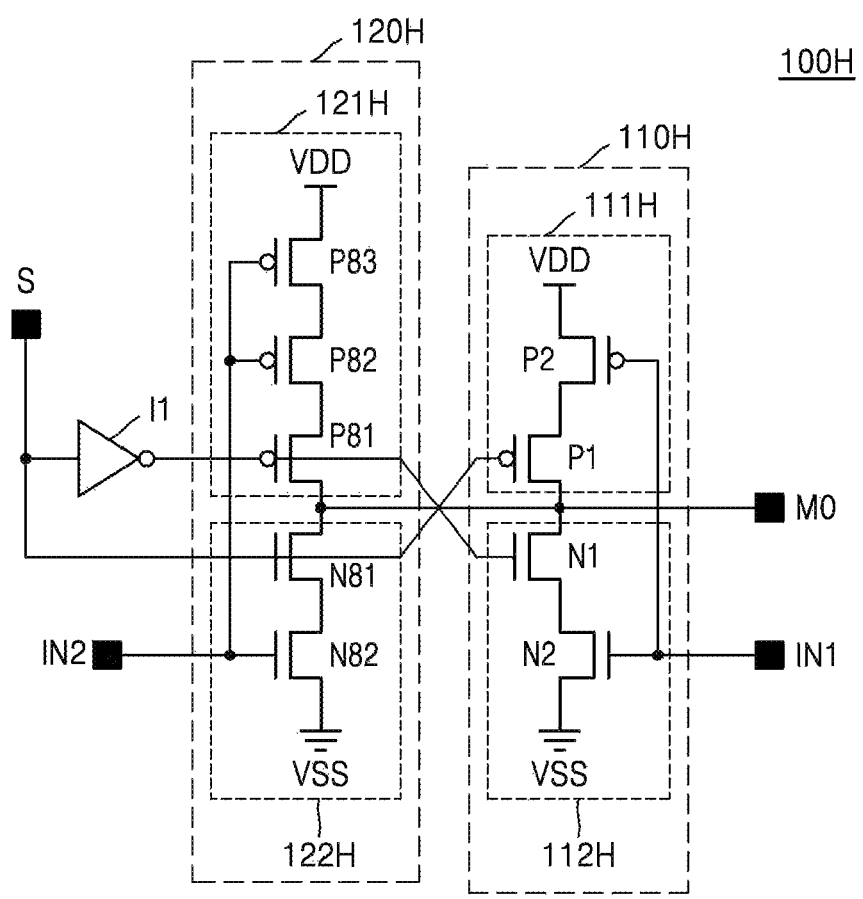
FIG. 9 illustrates a detailed circuit diagram of another example of the unbalanced multiplexer of FIG. 1.

FIG. 9 illustrates a detailed circuit diagram of another example 100H of the unbalanced multiplexer 100 of FIG. 1.

Referring to FIG. 9, the unbalanced multiplexer 100H includes a first transmission circuit 110H and a second transmission circuit 120H. The first transmission circuit 110H includes a first pull-up circuit 111H and a first pull-down circuit 112H. The second transmission circuit 120H includes a second pull-up circuit 121H and a second pull-down circuit 122H. In an embodiment of FIG. 9, the inverter I1 may be used to generate the inverted selection signal /S from the selection signal S.

The first transmission circuit 110H of FIG. 9 is substantially the same as the first transmission circuit 110A of FIG. 2, and thus redundant description of the first transmission circuit 110H will be avoided.

A configuration of the second transmission circuit 120H will be described.

Third group PMOS transistors P81, P82, and P83 included in the second pull-up circuit 121H have a cascode structure and are connected between the source voltage terminal VDD and the output terminal MO. The inverted selection signal /S is applied to a gate of one of the third group PMOS transistors P81, P82, and P83, and the second input signal IN2 is applied to gates of the other third group PMOS transistors. For example, in the embodiment of FIG. 9, the inverted selection signal /S is applied to a gate of the third group PMOS transistor P81, and the second input signal IN2 is applied to a gate of each of the third group PMOS transistors P82 and P83. In other embodiments, the inverted selection signal /S may be applied to the gate of either one of third group PMOS transistors P82 or P83, and the second input signal IN2 may be applied to the other two remaining gates of the third group PMOS transistors P81, P82 and P83.

Fourth group NMOS transistors N81 and N82 included in the second pull-down circuit 122H have the cascode structure and are connected between the output terminal MO and the ground voltage terminal VSS. The selection signal S is applied to a gate of one of the fourth group NMOS transistors N81 and N82, and the second input signal IN2 is applied to a gate of the other fourth group NMOS transistor. For example, in the embodiment of FIG. 9, the selection signal S is applied to a gate of the fourth group NMOS transistor N81, and the second input signal IN2 is applied to a gate of the fourth group NMOS transistor N82. In other embodiments, the selection signal S may be applied to a gate of the fourth group NMOS transistor N82, and the second input signal IN2 may be applied to a gate of the fourth group NMOS transistor N81.

A circuit operation according to a logic state of the selection signal S will now be described.

The PMOS transistor P1 of the first pull-up circuit 111H and the NMOS transistor N1 of the first pull-down circuit 112H are turned off when the selection signal S is in a logic high state, and the PMOS transistor P81 of the second pull-up circuit 121H and the NMOS transistor N81 of the second pull-down circuit 122H are turned on. Accordingly, the first transmission circuit 110H may be blocked, and the second input signal IN2 may be transmitted to the output terminal MO through the second transmission circuit 120H when the selection signal S is in the logic high state.

The PMOS transistor P1 of the first pull-up circuit 111H and the NMOS transistor N1 of the first pull-down circuit 112H are turned on when the selection signal S is in a logic low state, and the PMOS transistor P81 of the second pull-up circuit 121H and the NMOS transistor N81 of the second pull-down circuit 122H are turned off. Accordingly, the second transmission circuit 120H may be blocked, and the first input signal IN1 may be transmitted to the output terminal MO through the first transmission circuit 110H when the selection signal S is in the logic low state.

As shown in FIG. 9, the number of NMOS transistors having gates to which the second input signal IN2 is applied in the second pull-down circuit 122H of the second transmission circuit 120H is the same as the number of NMOS transistors having gates to which the first input signal IN1 is applied in the first pull-down circuit 112H of the first transmission circuit 110H. However, the number of PMOS transistors having gates to which the second input signal IN2 is applied in the second pull-up circuit 121H of the second transmission circuit 120H is one more than the number of PMOS transistors having gates to which the first input signal IN1 is applied in the first pull-up circuit 111H of the first transmission circuit 110H.

That is, one transistor to which the second input signal IN2 is applied is added, in the cascode structure, to the second pull-up circuit 121H of the second transmission circuit 120H to which the second input signal IN2 is transmitted, rather than being added to the first transmission circuit 110H to which the first input signal IN1 is transmitted.

As described above, a transistor is added to a second transmission path along which the second input signal IN2 is transmitted to the output terminal MO, rather than a first transmission path along which the first input signal IN1 is transmitted to the output terminal MO, and thus a current of the second transmission path may be reduced. Accordingly, a delay time with respect to the second transmission path may be greater than a delay time with respect to the first transmission path. In particular, a delay time difference between the second transmission path and the first transmission path may further increase at the low source voltage.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100H of FIG. 9 may be stably performed based on a delay time difference between the data signal and the scan signal. This will be described with reference to FIGS. 11 through 16.

Figure 10:
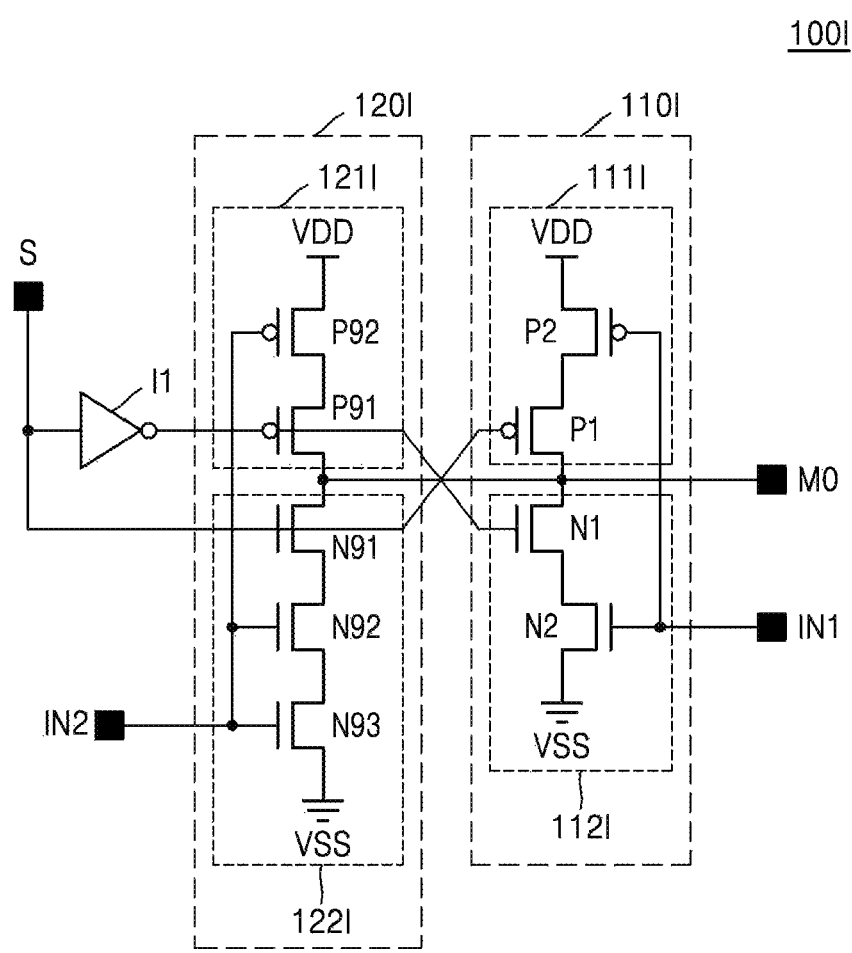
FIG. 10 illustrates a detailed circuit diagram of another example of the unbalanced multiplexer of FIG. 1.

FIG. 10 illustrates a detailed circuit diagram of another example 100I of the unbalanced multiplexer 100 of FIG. 1.

Referring to FIG. 10, the unbalanced multiplexer 100I includes a first transmission circuit 110I and a second transmission circuit 120I. The first transmission circuit 110I includes a first pull-up circuit 111I and a first pull-down circuit 112I. The second transmission circuit 120I includes a second pull-up circuit 121I and a second pull-down circuit 122I. In an embodiment of FIG. 10, the inverter I1 may be used to generate the inverted selection signal /S from the selection signal S.

The first transmission circuit 110I of FIG. 10 is substantially the same as the first transmission circuit 110A of FIG. 2, and thus redundant description of the first transmission circuit 110I will be avoided.

A configuration of the second transmission circuit 120I will be described.

Third group PMOS transistors P91 and P92 included in the second pull-up circuit 121I have a cascode structure and are connected between the source voltage terminal VDD and the output terminal MO. The inverted selection signal /S is applied to a gate of one of the third group PMOS transistors P91 and P92, and the second input signal IN2 is applied to gates of the other third group PMOS transistor. For example, in the embodiment of FIG. 10, the inverted selection signal /S is applied to a gate of the third group PMOS transistor P91, and the second input signal IN2 is applied to a gate of the third group PMOS transistor P92. In other embodiments, the inverted selection signal /S may be applied to a gate of the third group PMOS transistor P92, and the second input signal IN2 may be applied to a gate of the third group PMOS transistor P91.

Fourth group NMOS transistors N91, N92, and N93 included in the second pull-down circuit 122I have the cascode structure and are connected between the output terminal MO and the ground voltage terminal VSS. The selection signal S is applied to a gate of one of the fourth group NMOS transistors N91, N92, and N93, and the second input signal IN2 is applied to gates of the other fourth group NMOS transistors. For example, in the embodiment of FIG. 10, the selection signal S is applied to a gate of the fourth group NMOS transistor N91, and the second input signal IN2 is applied to a gate of each of the fourth group NMOS transistors N92 and N93. In other embodiments, the selection signal S may be applied to the gate of either one of fourth group NMOS transistors N92 and N93, and the second input signal IN2 may be applied to the other two remaining gates of the fourth group NMOS transistors N91, N92 and N93.

A circuit operation according to a logic state of the selection signal S will now be described.

The PMOS transistor P1 of the first pull-up circuit 111I and the NMOS transistor N1 of the first pull-down circuit 112I are turned off when the selection signal S is in a logic high state, and the PMOS transistor P91 of the second pull-up circuit 121I and the NMOS transistor N91 of the second pull-down circuit 122I are turned on. Accordingly, the first transmission circuit 110I may be blocked, and the second input signal IN2 may be transmitted to the output terminal MO through the second transmission circuit 120I when the selection signal S is in the logic high state.

The PMOS transistor P1 of the first pull-up circuit 111I and the NMOS transistor N1 of the first pull-down circuit 112I are turned on when the selection signal S is in a logic low state, and the PMOS transistor P91 of the second pull-up circuit 121I and the NMOS transistor N91 of the second pull-down circuit 122I are turned off. Accordingly, the second transmission circuit 120I may be blocked, and the first input signal IN1 may be transmitted to the output terminal MO through the first transmission circuit 110I when the selection signal S is in the logic low state.

As shown in FIG. 10, the number of PMOS transistors having gates to which the second input signal IN2 is applied in the second pull-up circuit 121I of the second transmission circuit 120I is the same as the number of PMOS transistors having gates to which the first input signal IN1 is applied in the first pull-up circuit 111I of the first transmission circuit 110I. However, the number of NMOS transistors having gates to which the second input signal IN2 is applied in the second pull-down circuit 122I of the second transmission circuit 120I is one more than the number of PMOS transistors having gates to which the first input signal IN1 is applied in the first pull-down circuit 112I of the first transmission circuit 110I.

That is, one transistor to which the second input signal IN2 is applied is added, in the cascode structure, to the second pull-down circuit 121I of the second transmission circuit 120I to which the second input signal IN2 is transmitted, rather than being added to the first transmission circuit 110I to which the first input signal IN1 is transmitted.

As described above, a transistor is added to a second transmission path along which the second input signal IN2 is transmitted to the output terminal MO, rather than a first transmission path along which the first input signal IN1 is transmitted to the output terminal MO, and thus a current of the second transmission path may be reduced. Accordingly, a delay time with respect to the second transmission path may be greater than a delay time with respect to the first transmission path. In particular, a delay time difference between the second transmission path and the first transmission path may further increase at the low source voltage.

For example, when the first input signal IN1 is set as a data signal, the second input signal IN2 is set as a scan input signal, and the selection signal S is set as a scan enable signal, a scan shift operation of a scan flip-flop that applies the unbalanced multiplexer 100I of FIG. 10 may be stably performed based on a delay time difference between the data signal and the scan signal. This will be described with reference to FIGS. 11 through 16.

A scan flip flop that applies an unbalanced multiplexer according to embodiments of the inventive concept will be described below.

Figure 11:
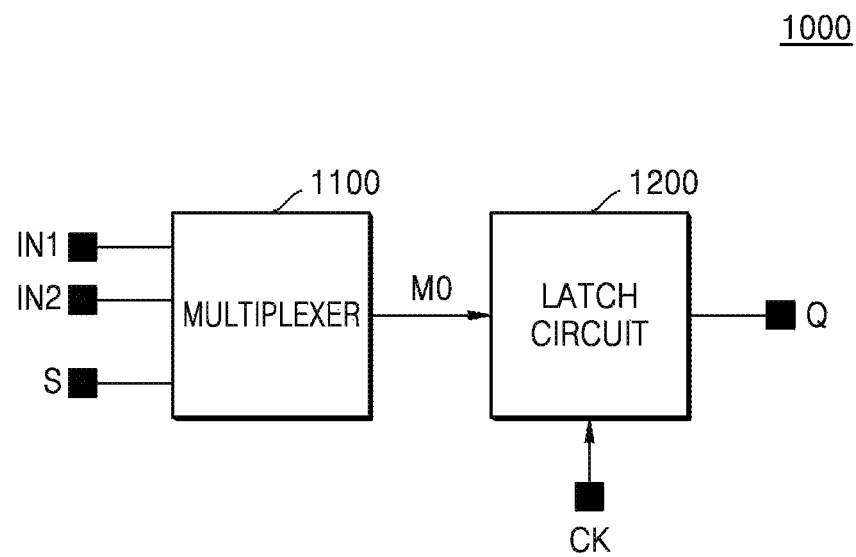
FIG. 11 illustrates a block diagram of a scan flip flop according to an embodiment of the inventive concept.

FIG. 11 illustrates a block diagram of a scan flip flop 1000 according to an embodiment of the inventive concept.

As shown in FIG. 11, the scan flip flop 1000 includes a multiplexer 1100 and a latch circuit 1200.

The multiplexer 1100 has the first input signal IN1 applied to a first input terminal and the second input signal IN2 applied to a second input terminal, and may transmit one of the first input signal IN1 and the second input signal IN2 to the output terminal MO according to a logic state of the selection signal S applied to the selection terminal. The multiplexer 1100 is designed such that a delay characteristic with respect to a first transmission path along which the first input signal IN1 is transmitted to the output terminal MO and a delay characteristic with respect to a second transmission path along which the second input signal IN2 is transmitted to the output terminal MO are different from each other. For example, the first input signal IN1 may be set as a data signal, the second input signal IN2 may be set as a scan input signal, and the selection signal S may be set as a scan enable signal. The multiplexer 1100 may be designed such that a delay time with respect to the second transmission path along which the second input signal IN2 is transmitted to the output terminal MO is greater than a delay time with respect to the first transmission path along which the first input signal IN1 is transmitted to the output terminal MO.

For example, the multiplexer 1100 may be configured as including the features of unbalanced multiplexer 100 of FIG. 1. In more detail, the multiplexer 1100 may be configured as including the features of one of the unbalanced multiplexers 100A through 100I of the embodiments of FIGS. 2 through 10.

The latch circuit 1200 may function to maintain the first input signal IN1 or the second input signal IN2 that is output from the multiplexer 1100 in synchronization with a clock signal CK, and to transfer the first input signal IN1 or the second input signal IN2 to an output terminal Q. For example, the first input signal IN1 may be the data signal, and the second input signal IN2 may be the scan input signal.

Figure 12:
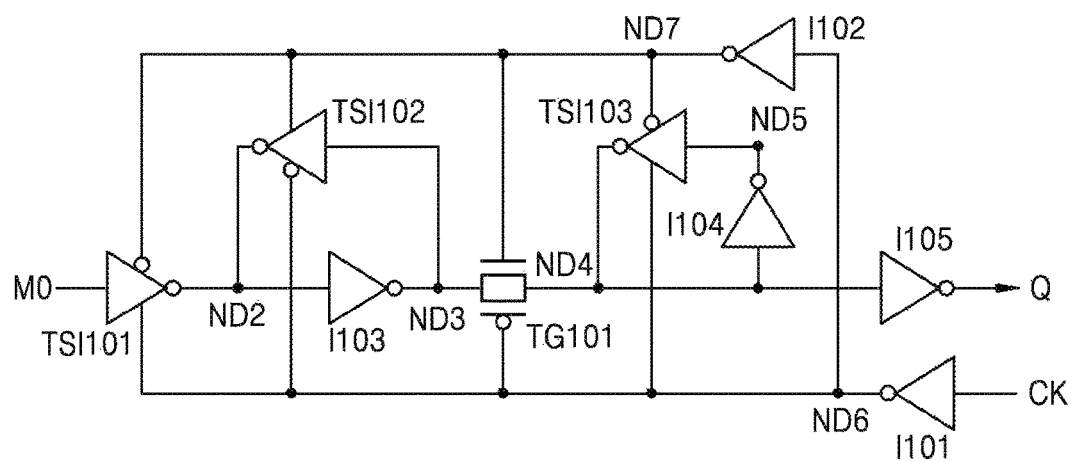
FIG. 12 illustrates an example of a detailed configuration of a latch circuit of FIG. 11.

FIG. 12 illustrates an example 1200A of a detailed configuration of the latch circuit 1200 of FIG. 11.

Referring to FIG. 12, the latch circuit 1200A includes a plurality of tri-state inverters TSI101, TSI102, and TSI103, a plurality of inverters I101, I102, I103, I104, and I105, and a transmission gate TG101.

The clock signal CK is input to the first inverter I101, which inverts the input clock signal CK and outputs the inverted clock signal CK to a sixth node ND6. The second inverter I102 inverts the inverted clock signal /CK present at the sixth node ND6 and provides an output to a seventh node ND7.

The first tri-state inverter TSI101 inverts a signal from the output terminal MO of the multiplexer 1100 and outputs the inverted signal to a second node ND2 when the inverted clock signal /CK at the sixth node ND6 is in a logic high state. The first tri-state inverter TSI101 is in a high impedance state when the inverted clock signal /CK at the sixth node ND6 is in a logic low state.

The third inverter I103 inverts a signal present at the second node ND2 and outputs the inverted signal to a third node ND3.

The second tri-state inverter TSI102 inverts a signal present at the third node ND3, and outputs the inverted signal to the second node ND2 when the clock signal CK at the seventh node ND7 is in a logic high state. The second tri-state inverter TSI102 is in a high impedance state when the clock signal CK at the seventh node ND7 is in a logic low state.

The transmission gate TG101 transfers the signal present at the third node ND3 to a fourth node ND4 when the clock signal CK of the seventh node ND7 is in a logic high state. The transmission gate TG101 does not transfer the signal present at the third node ND3 to the fourth node ND4 when the clock signal CK of the seventh node ND7 is in a logic low state.

The fourth inverter I104 inverts and a signal present at the fourth node ND4 and outputs the inverted signal to a fifth node ND5.

The third tri-state inverter TSI103 inverts a signal present at the fifth node ND5 and outputs the inverted signal to the fourth node ND4 when the inverted clock signal /CK at the sixth node ND6 is in a logic high state. The third tri-state inverter TSI103 is in a high impedance state when the inverted clock signal /CK at the sixth node ND6 is in a logic low state.

The fifth inverter I105 inverts a signal present at the fourth node ND4 and outputs the inverted signal to the output terminal Q.

According to the operations above, when the clock signal CK is in a logic low state, a signal at the output terminal MO of the multiplexer 1100 may be transferred to the second node ND2 through the first tri-state inverter TSI101, and the transmission gate TG101 may be blocked. The signal of the fourth node ND4 may be maintained as it is by the third tri-state inverter TSI103 and the fourth inverter I104.

When the clock signal CK is in a logic high state, the first tri-state inverter TSI101 may be in a high impedance state, and the second tri-state inverter TSI102 may perform an inverting operation, and thus the signals at the second node ND2 and the third node ND3 may be maintained as they are. The signal at the third node ND3 may be transferred to the fourth node ND4 through the transmission gate TG101.

Figure 13:
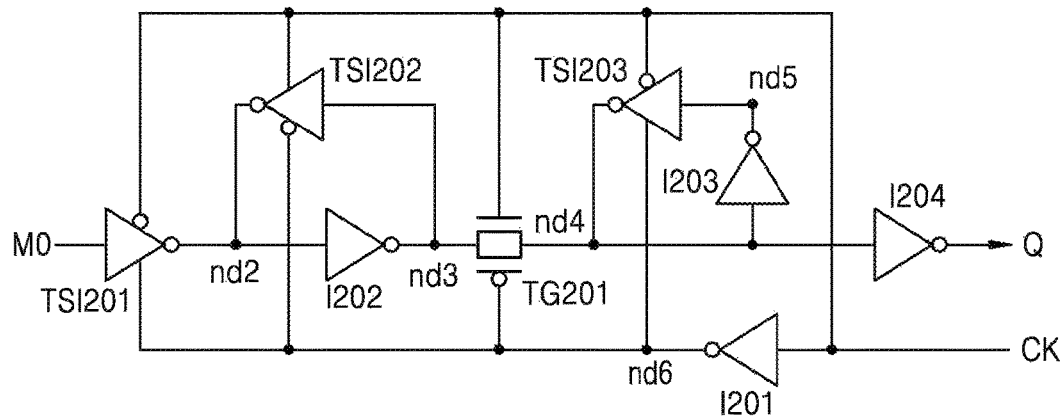
FIG. 13 illustrates another example of a detailed configuration of a latch circuit of FIG. 11.

FIG. 13 illustrates another example 1200B of a detailed configuration of the latch circuit 1200 of FIG. 11.

Referring to FIG. 13, the latch circuit 1200B includes a plurality of tri-state inverters TSI201, TSI202, and TSI203, a plurality of inverters I201, I202, I203, and I204, and a transmission gate TG201.

The clock signal CK at a clock terminal is input to the first inverter I201, which inverts the clock signal CK and outputs the inverted clock signal CK to a sixth node nd6.

The first tri-state inverter TSI201 inverts a signal from the output terminal MO of the multiplexer 1100 and outputs the inverted signal to a second node nd2 when the inverted clock signal /CK at the sixth node nd6 is in a logic high state. The first tri-state inverter TSI201 is in a high impedance state when the inverted clock signal /CK at the sixth node nd6 is in a logic low state.

The second inverter I202 inverts a signal present at the second node nd2 and outputs the inverted signal to a third node nd3.

The second tri-state inverter TSI202 inverts a signal present at the third node nd3 and outputs the inverted signal to the second node nd2 when the clock signal CK is in a logic high state. The second tri-state inverter TSI202 is in a high impedance state when the clock signal CK is in a logic low state.

The transmission gate TG201 transfers the signal present at the third node nd3 to a fourth node nd4 when the clock signal CK is in a logic high state. The transmission gate TG201 does not transfer the signal present at the third node nd3 to the fourth node nd4 when the clock signal CK is in a logic low state.

The third inverter I203 inverts a signal present at the fourth node nd4 and outputs the inverted signal to a fifth node nd5.

The third tri-state inverter TSI203 inverts a signal present at the fifth node nd5 and outputs the inverted signal to the fourth node nd4 when the inverted clock signal /CK of the sixth node nd6 is in a logic high state. The three tri-state inverter TSI203 is in a high impedance state when the inverted clock signal /CK of the sixth node nd6 is in a logic low state.

The fourth inverter I204 inverts a signal present at the fourth node nd4 and outputs the inverted signal to the output terminal Q.

According to the operations above, when the clock signal CK is in a logic low state, a signal at the output terminal MO of the multiplexer 1100 may be transferred to the second node nd2 through the first tri-state inverter TSI201, and the transmission gate TG201 may be blocked. The signal of the fourth node nd4 may be maintained as it is by the third tri-state inverter TSI203 and the third inverter I203.

When the clock signal CK is in a logic high state, the first tri-state inverter TSI201 may be in a high impedance state, and the second tri-state inverter TSI202 may perform an inverting operation, and thus the signals at the second node nd2 and the third node nd3 may be maintained as they are. The signal at the third node nd3 may be transferred to the fourth node nd4 through the transmission gate TG201.

The latch circuit 1200A of FIG. 12 uses the two inverters I101 and I102 to invert the clock signal CK, whereas the latch circuit 1200B of FIG. 13 uses the one inverter I201 to invert the clock signal CK.

A data processing device to which a scan flip-flop is applied according to embodiments of the inventive concept will be described below.

Figure 14:
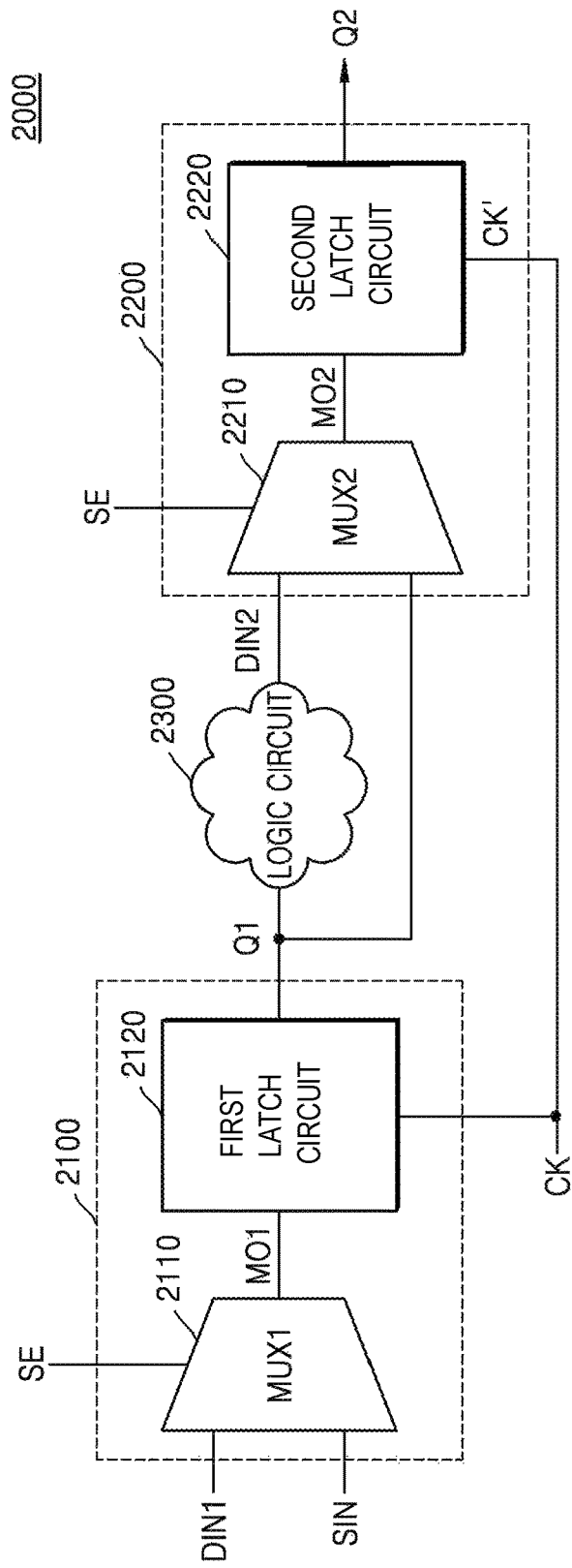
FIG. 14 illustrates a block diagram of a data processing device to which scan flip-flops according to embodiments of the inventive concept may be applied.

FIG. 14 illustrates a block diagram of a data processing device 2000 to which a scan flip-flop according to embodiments of the inventive concept is applied.

As shown in FIG. 14, the data processing device 2000 includes a first scan flip-flop 2100, a second scan flip-flop 2200, and a logic circuit 2300.

Each of the first scan flip-flop 2100 and the second scan flip-flop 2200 may be configured to include the features of the scan flip-flop 1000 of FIG. 11.

The first scan flip-flop 2100 includes a first multiplexer MUX1 2110 and a first latch circuit 2120. For example, the first multiplexer 2110 may be one of the unbalanced multiplexers 100A through 100I of FIGS. 2 through 10, and the first latch circuit 2120 may be one of the latch circuits 1200A and 1200B of FIGS. 12 and 13.

A first data signal DIN1 and a scan input signal SIN are input to the first multiplexer 2110. The first multiplexer 2110 selects one of the first data signal DIN1 and the scan input signal SIN according to a logic state of a scan enable signal SE, and outputs the selected signal to a first output terminal MO1. For example, when the scan enable signal SE is in a logic high state, the first multiplexer 2110 outputs the scan input signal SIN to the first output terminal MO1. When the scan enable signal SE is in a logic low state, the first multiplexer 2110 outputs the data signal DIN to the first output terminal MO1.

The first latch circuit 2120 maintains the first data signal DIN1 or the scan input signal SIN that is output from the first output terminal MO1 of the first multiplexer 2110 in synchronization with the clock signal CK, and transfers the first data signal DIN1 or the scan input signal SIN to a second output terminal Q1.

The logic circuit 2300 may perform logic calculation processing on the first data signal DIN1 or the scan input signal SIN that is output from the second output terminal Q1 of the first scan flip-flop 2100, and may output a second data signal DIN2 corresponding to a processing result to the second scan flip-flop 2200.

The second scan flip-flop 2200 includes a second multiplexer MUX2 2210 and a second latch circuit 2220. For example, the second multiplexer 2210 may be one of the unbalanced multiplexers 100A through 100I of FIGS. 2 through 10. The second latch circuit 2220 may be one of the latch circuits 1200A and 1200B of FIGS. 12 and 13.

The second data signal DIN2 and a signal present at the second output terminal Q1 are input to the. The second multiplexer 2210 selects one of the second data signal DIN2 and the signal present at the second output terminal Q1 according to a logic state of the scan enable signal SE, and outputs the selected signal to a third output terminal MO2. For example, when the scan enable signal SE is in a logic high state, the second multiplexer 2210 outputs the signal present at the second output terminal Q1 to the third output terminal MO2. Of note, when the scan enable signal SE is in a logic high state, the first scan flip-flop 2100 selects, latches, and outputs the scan input signal SIN to the second output terminal Q1. When the scan enable signal SE is in a logic low state, the second multiplexer 2210 outputs the second data signal DIN2 to the third output terminal MO2.

The second latch circuit 2220 maintains the second data signal DIN2 or the scan input signal SIN that is output from the third output terminal MO2 of the second multiplexer 2210 in synchronization with the clock signal CK, and transfers the second data signal DIN2 or the scan input signal SIN to a fourth output terminal Q2.

For example, when the scan enable signal SE is in a logic high state, the first scan flip-flop 2100 and the second scan flip-flop 2200 perform a scan shift operation in synchronization with a clock signal.

Figure 15:
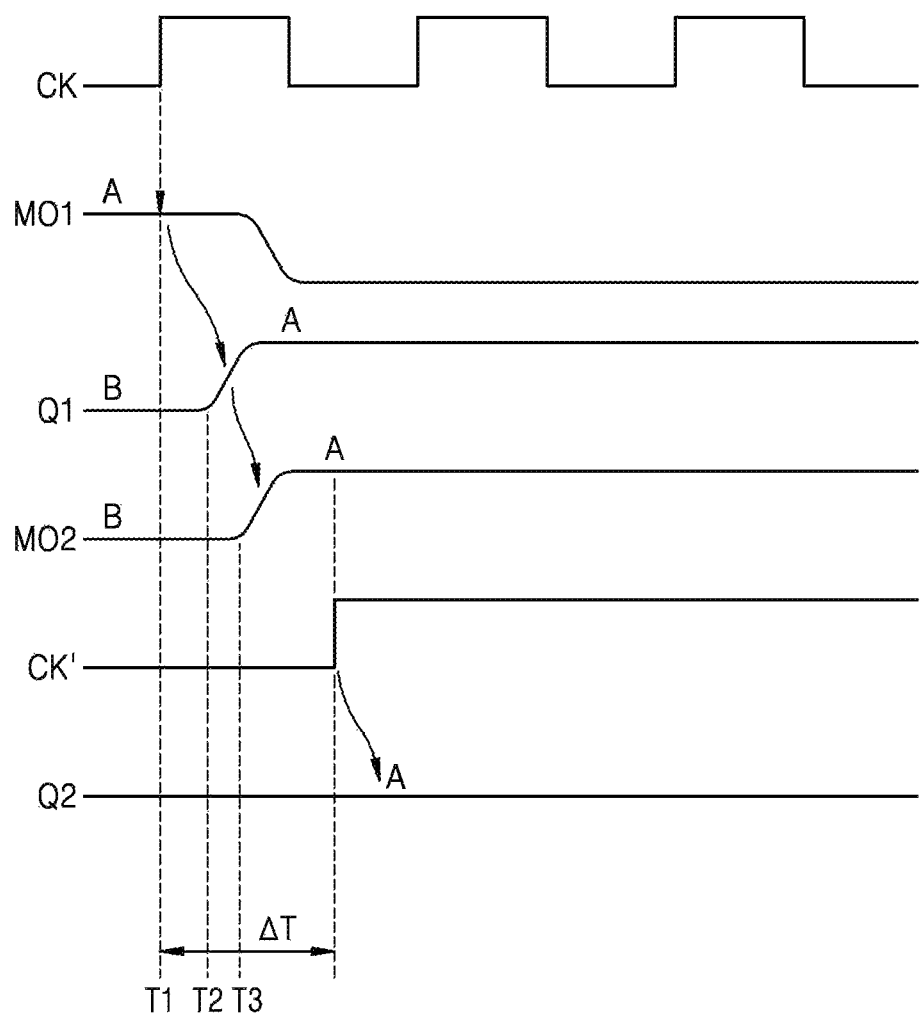
FIG. 15 illustrates a waveform diagram of main nodes when a delay time with respect to a transmission path of a scan input signal is set to be almost equally as short as a delay time with respect to a transmission path of a data signal in the scan flip-flops of the data processing device of FIG. 14.

FIG. 15 illustrates a waveform diagram of main nodes when a delay time with respect to a transmission path of the scan input signal SIN is set almost equally as short as a delay time with respect to a transmission path of a data signal in the first and second scan flip-flops 2100 and 2200 of the data processing device 2000 of FIG. 14.

In a section where the scan enable signal SE is in a logic high state, "A" of the scan input signal SIN may be transmitted to the first output terminal MO1 within the first scan flip-flop 2100. "A" of the scan input signal SIN of the first output terminal MO1 may have transmission and latch operations performed thereon at a time T1 of the clock signal CK and may be output to the second output terminal Q1 at a time T2 by the first latch circuit 2120. Of note, a signal of the second output terminal Q1 before a time T3 may be "B" of the scan input signal SIN. Also of note, the "B" of the scan input signal SIN may mean a state of the scan input signal SIN before the state "A" of the scan input signal SIN is generated.

If a clock signal CK' applied to the second scan flip-flop 2200 is delayed by ΔT compared to the clock signal CK applied to the first scan flip-flop 2100, the "A" of the scan input signal SIN at the third output terminal MO2 will have transmission and latch operations performed thereon after delay ΔT by the second latch circuit 2220, and the "A" of the scan input signal SIN will be output to the fourth output terminal Q2 of the second scan flip-flop 2200.

Referring to the block diagram of FIG. 14, when the scan enable signal SE is in a logic high state, the first scan flip-flop 2100 and the second scan flip-flop 2200 may sequentially shift the scan input signal SIN according to a clock signal. Accordingly, in a normal state, when the "A" of the scan input signal SIN is output to the second output terminal Q1 of the first scan flip-flop 2100, the "B" of the scan input signal SIN needs to be output to the fourth output terminal Q2 of the second scan flip-flop 2200.

However, when the "A" of the scan input signal SIN is output late to the second output terminal Q1 of the first scan flip-flop 2100 due to a delay of the clock signal CK, an error may occur in that the "A" of the scan input signal SIN is output to the fourth output terminal Q2 of the second scan flip-flop 2200.

Figure 16:
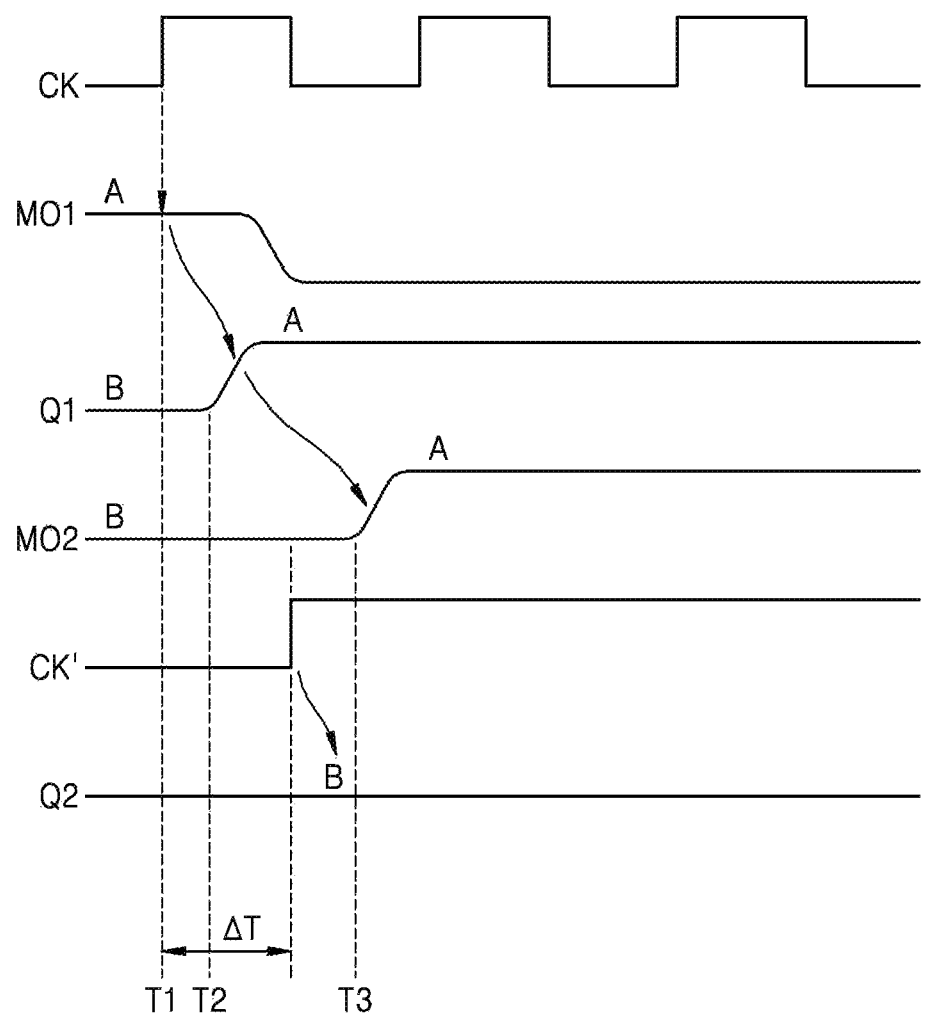
FIG. 16 illustrates a waveform diagram of main nodes of the data processing device of FIG. 14 to which scan flip-flops according to embodiments of the inventive concept are applied.

FIG. 16 illustrates a waveform diagram of main nodes of the data processing device 2000 to which scan flip-flops according to embodiments of the inventive concept are used in FIG. 14.

That is, FIG. 16 is a waveform diagram of main nodes when a delay time with respect to a transmission path of the scan input signal SIN in the first and second scan flip-flops 2100 and 2200 of the data processing device 2000 of FIG. 14 is greater than a delay time with respect to a transmission path of a data signal.

When the scan enable signal SE is in a logic high state, the "A" of the scan input signal SIN may be transmitted to the first output terminal MO1 within the first scan flip-flop 2100. The "A" of the scan input signal SIN at the first output terminal MO1 may have transmission and latch operations performed thereon at the time T1 of the clock signal CK and may be output to the second output terminal Q1 at the time T2 by the first latch circuit 2120. Due to delay time with respect to the transmission path of the scan input signal SIN being greater than a delay time with respect to the transmission path of the data signal, a signal of the second output terminal Q1 may be transferred to the third output terminal MO2 of the second scan flip-flop 2200 at the time T3. Of note, the signal of the second output terminal Q1 before the time T3 may be the "B" of the scan input signal SIN. Also of note, the "B" of the scan input signal SIN may mean a state of the scan input signal SIN before the state "A" of the scan input signal SIN is generated.

Referring to FIG. 16, if it happens that the clock signal CK' applied to the second scan flip-flop 2200 is delayed by ΔT compared to the clock signal CK applied to the first scan flip-flop 2100, the "B" of the scan input signal SIN at the third output terminal MO2 will have transmission and latch operations performed thereon after delay ΔT by the second latch circuit 2220 and the "B" of the scan input signal SIN will be correctly output as it should in a normal state to the fourth output terminal Q2 of the second scan flip-flop 2200.

Accordingly, when the first multiplexer 2110 and the second multiplexer 2210 included in the first scan flip-flop 2100 and the second scan flip-flop 2200 of the data processing device 2000 of FIG. 14 are configured to include one of the unbalanced multiplexers 100A through 100I of embodiments of the inventive concept shown in FIGS. 2 through 10, the delay time with respect to the transmission path along which the scan input signal SIN is transmitted may increase. Thus, even though the clock signal may be delayed, the first scan flip-flop 2100 and the second scan flip-flop 2200 may normally perform a scan shift operation.

While the inventive concept has been particularly shown and described with reference to embodiments thereof, it should be understood that various changes in form and details may be made therein without departing from the spirit and scope of the following claims.

What is claimed is:

1. An unbalanced multiplexer comprising:
   a first transmission circuit comprising a first pull-up circuit connected between a source voltage terminal and an output terminal, and a first pull-down circuit connected between the output terminal and a ground voltage terminal, the first transmission circuit configured to apply a selection signal and a first input signal to the first pull-up circuit and to apply the first input signal and an inverted version of the selection signal to the first pull-down circuit, and to transmit the first input signal to the output terminal according to a logic state of the selection signal; and
   a second transmission circuit comprising a second pull-up circuit connected between the source voltage terminal and the output terminal, and a second pull-down circuit connected between the output terminal and the ground voltage terminal, the second transmission circuit configured to apply the selection signal and a second input signal to the second pull-down circuit and to apply the second input signal and the inverted version of the selection signal to the second pull-up circuit, and to transmit the second input signal to the output terminal according to the logic state of the selection signal,
   wherein a delay characteristic of a first transmission path from a first input terminal to the output terminal along which the first input signal of the first transmission circuit is transmitted, and a delay characteristic of a second transmission path from a second input terminal to the output terminal along which the second input signal of the second transmission circuit is transmitted, are set to be different.

2. The unbalanced multiplexer of claim 1, wherein a data signal is applied to the first input terminal as the first input signal, a scan input signal is applied to the second input terminal as the second input signal, the selection signal is a scan enable signal, and the second transmission path is configured to have a delay time that is greater than a delay time of the first transmission path.

3. The unbalanced multiplexer of claim 1, wherein the first pull-up circuit comprises first group p-type metal-oxide-semiconductor (PMOS) transistors connected between the source voltage terminal and the output terminal in a cascode arrangement, the first pull-down circuit comprises second group n-type metal-oxide-semiconductor (NMOS) transistors connected between the output terminal and the ground voltage terminal in a cascode arrangement, the second pull-up circuit comprises third group PMOS transistors connected between the source voltage terminal and the output terminal in a cascode arrangement, and the second pull-down circuit comprises fourth group NMOS transistors connected between the output terminal and the ground voltage terminal in a cascode arrangement,
   wherein the selection signal is a scan enable signal that is applied to a gate of one of the first group PMOS transistors, the inverted version of the selection signal is an inverted version of the scan enable signal that is applied to a gate of one of the second group NMOS transistors, and the first input signal is a data signal that is applied to a gate of each of the first group PMOS transistors other than the one of the first group PMOS transistors and each of the second group NMOS transistors other than the one of the second group NMOS transistors,
   wherein the inverted version of the scan enable signal is applied to a gate of one of the third group PMOS transistors, the scan enable signal is applied to a gate of one of the fourth group NMOS transistors, and the second input signal is a scan input signal that is applied to a gate of each of the third group PMOS transistors other than the one of the third group PMOS transistors and each of the fourth group NMOS transistors other than the one of the fourth group NMOS transistors, and
   wherein the second pull-up circuit or the second pull-down circuit is configured to have a delay time when the scan input signal is transmitted to the output terminal through the second pull-up circuit or the second pull-down circuit that is greater than a delay time when the data signal is transmitted to the output terminal through the first pull-up circuit or the first pull-down circuit.

4. The unbalanced multiplexer of claim 3, wherein a number of transistors having gates to which the scan input signal is applied from among the third group PMOS transistors and the fourth group NMOS transistors is greater than a number of transistors having gates to which the data signal is applied from among the first group PMOS transistors and the second group NMOS transistors.

5. The unbalanced multiplexer of claim 4, wherein a number of the third group PMOS transistors having gates to which the scan input signal is applied is the same as a number of the fourth group NMOS transistors having gates to which the scan input signal is applied.

6. The unbalanced multiplexer of claim 4, wherein a number of the third group PMOS transistors having gates to which the scan input signal is applied and a number of the fourth group NMOS transistors having gates to which the scan input signal is applied are asymmetrically different from each other.

7. The unbalanced multiplexer of claim 4, wherein one of a number of the third group PMOS transistors having gates to which the scan input signal is applied and a number of the fourth group NMOS transistors having gates to which the scan input signal is applied is greater than the other.

8. The unbalanced multiplexer of claim 3, wherein a number of the first group PMOS transistors and a number of the third group PMOS transistors are the same, a number of the second group NMOS transistors and a number of the fourth group NMOS transistors are the same, and a length of a gate of at least one of the third group PMOS transistors or the fourth group NMOS transistors is greater than a length of a gate of each of the first group PMOS transistors and the second group NMOS transistors.

9. The unbalanced multiplexer of claim 3, wherein a number of the first group PMOS transistors and a number of the third group PMOS transistors are the same, a number of the second group NMOS transistors and a number of the fourth group NMOS transistors are the same, and at least one of the third group PMOS transistors or the fourth group NMOS transistors is configured to have a threshold voltage higher than a threshold voltage of each of the first group PMOS transistors and the second group NMOS transistors.

10. An unbalanced multiplexer comprising:
    a first transmission circuit configured to transmit a first signal along a first transmission path from a first input terminal to an output terminal according to a logic state of a selection signal, wherein the first transmission path comprises first group p-type metal-oxide-semiconductor (PMOS) transistors in a cascode arrangement connected to second group n-type metal-oxide-semiconductor (NMOS) transistors in a cascode arrangement; and a second transmission circuit configured to transmit a second signal along a second transmission path from a second input terminal to the output terminal according to the logic state of the selection signal, wherein the second transmission path comprises third group PMOS transistors in a cascode arrangement connected to fourth group NMOS transistors in a cascode arrangement, wherein the first transmission path is configured to have a delay characteristic that is set to be different than a delay characteristic of the second transmission path, wherein a number of transistors in the first group PMOS transistors, a number of transistors in the second group NMOS transistors, a number of transistors in the third group PMOS transistors and a number of transistors in the fourth group NMOS transistors are the same, and a length of a gate of at least one of the transistors in the third group PMOS transistors and a length of a gate in at least one of the transistors in the fourth group NMOS transistors are greater than a length of each of the transistors in the first group PMOS transistors and in the second group NMOS transistors.

11. An unbalanced multiplexer of claim comprising:

a first transmission circuit configured to transmit a first signal along a first transmission path from a first input terminal to an output terminal according to a logic state of a selection signal, wherein the first transmission path comprises first group p-type metal-oxide-semiconductor (PMOS) transistors in a cascode arrangement connected to second group n-type metal-oxide-semiconductor (NMOS) transistors in a cascode arrangement; and a second transmission circuit configured to transmit a second signal along a second transmission path from a second input terminal to the output terminal according to the logic state of the selection signal, wherein the second transmission path comprises third group PMOS transistors in a cascode arrangement connected to fourth group NMOS transistors in a cascode arrangement, wherein the first transmission path is configured to have a delay characteristic that is set to be different than a delay characteristic of the second transmission path, wherein a number of transistors in the first group PMOS transistors, a number of transistors in the second group NMOS transistors, a number of transistors in the third group PMOS transistors and a number of transistors in the fourth group NMOS transistors are the same, and a threshold voltage of at least one of the transistors in the third group PMOS transistors and a threshold voltage of at least one of the transistors in the fourth group NMOS transistors are higher than a threshold voltage of each of the transistors in the first group PMOS transistors and in the second group NMOS transistors.

\* \* \* \* \*